US012068418B2

(12) United States Patent
Yeom et al.

(10) Patent No.: US 12,068,418 B2
(45) Date of Patent: Aug. 20, 2024

(54) INTEGRATED CIRCUIT DEVICE

(71) Applicant: SAMSUNG ELECTRONICS CO., LTD., Suwon-si (KR)

(72) Inventors: Kyongsik Yeom, Suwon-si (KR); Youngcheon Jeong, Hwaseong-si (KR); Yongkyu Lee, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 135 days.

(21) Appl. No.: 17/580,717

(22) Filed: Jan. 21, 2022

(65) Prior Publication Data

US 2022/0416076 A1 Dec. 29, 2022

(30) Foreign Application Priority Data

Jun. 29, 2021 (KR) .......................... 10-2021-0084792

(51) Int. Cl.
*H01L 29/423* (2006.01)
*H01L 29/66* (2006.01)
(Continued)

(52) U.S. Cl.
CPC ...... *H01L 29/788* (2013.01); *H01L 29/42328* (2013.01); *H01L 29/42336* (2013.01);
(Continued)

(58) Field of Classification Search
CPC ............ H01L 29/788; H01L 29/42328; H01L 29/42336; H01L 29/6656; H01L 29/66825;
(Continued)

(56) References Cited

U.S. PATENT DOCUMENTS 8,445,953 B2   5/2013  Shen et al.
8,785,307 B2 * 7/2014  Liu ................... H01L 21/26586
                                                     438/510
(Continued)

FOREIGN PATENT DOCUMENTS

TW   201639163   11/2016
TW   201926580    7/2019

OTHER PUBLICATIONS

Search Report in Taiwanese Appln. No. 111117058, mailed on Feb. 7, 2024, 1 page.

*Primary Examiner* — David Vu
(74) *Attorney, Agent, or Firm* — Fish & Richardson P.C.

(57) ABSTRACT

An integrated circuit includes; a source region arranged in an upper portion of a substrate, a pair of split gate structures respectively on opposing sides of the source region, wherein each of the pair of split gate structures includes a floating gate electrode layer and a control gate electrode layer disposed on the floating gate electrode layer, an erase gate structure between the pair of split gate structures on the source region and including an erase gate electrode layer, a pair of selection gate structures respectively on outer sidewalls of the pair of split gate structures, and a pair of gate spacers, wherein each of the gate spacers is disposed between one of the pair of split gate structures and one of the pair of selection gate structures, includes a first gate spacer and a second gate spacer disposed on the first gate spacer, is further disposed on an outer side wall of the one of the pair of split gate structures, and a lowermost end of the second gate spacer is at a lower level than an upper surface of the floating gate electrode layer.

15 Claims, 36 Drawing Sheets

(51) Int. Cl.
*H01L 29/788* (2006.01)
*H10B 41/35* (2023.01)
*H10B 41/41* (2023.01)

(52) U.S. Cl.
CPC .... *H01L 29/6656* (2013.01); *H01L 29/66825* (2013.01); *H10B 41/35* (2023.02); *H10B 41/41* (2023.02)

(58) Field of Classification Search
CPC ............. H01L 29/6653; H01L 29/7881; H01L 21/28141; H10B 41/35; H10B 41/41; H10B 41/30
See application file for complete search history.

(56) References Cited

U.S. PATENT DOCUMENTS

| | | | |
|---|---|---|---|
| 9,276,010 B2 | 3/2016 | Chuang et al. | |
| 9,496,276 B2 | 11/2016 | Chuang et al. | |
| 9,634,019 B1 | 4/2017 | Zhou et al. | |
| 9,960,172 B2 | 5/2018 | Yang et al. | |
| 10,090,399 B2 | 10/2018 | Tokita et al. | |
| 10,276,588 B2 | 4/2019 | Chuang et al. | |
| 10,297,604 B2 | 5/2019 | Wu et al. | |
| 10,475,891 B2 | 11/2019 | Liu et al. | |
| 10,615,270 B2 | 4/2020 | Wang et al. | |
| 10,658,027 B2 | 5/2020 | Do et al. | |
| 11,063,772 B2 | 7/2021 | Chen et al. | |
| 2006/0234444 A1 | 10/2006 | Wu et al. | |
| 2007/0093024 A1 | 4/2007 | Fu et al. | |
| 2011/0070726 A1* | 3/2011 | Dickenscheid | H01L 29/40114 257/E21.423 |
| 2016/0163722 A1* | 6/2016 | Chang | H01L 29/40114 257/316 |
| 2016/0336415 A1 | 11/2016 | Wu et al. | |
| 2017/0125432 A1* | 5/2017 | Richter | H10B 41/41 |

* cited by examiner

INTEGRATED CIRCUIT DEVICE

CROSS-REFERENCE TO RELATED APPLICATION

This application claims priority under 35 U.S.C. § 119 to Korean Patent Application No. 10-2021-0084792 filed on Jun. 29, 2021 in the Korean Intellectual Property Office, the subject matter of which is hereby incorporated by reference its entirety.

BACKGROUND

The inventive concept relates to integrated circuit (IC) devices, and more particularly, to IC devices including a split gate structure.

In response to user demands, a myriad of contemporary and emerging electronic devices provide enhanced functionality with reduced physical size and weight. As a result of these trends, many of the IC devices (e.g., memory and logic devices) constituent to such electronic devices face demands for improved performance, as well as reduced size, power consumption and/or cost.

Accordingly, research is ongoing into various approaches that may result in better integration of memory and logic components and/or elements within a single IC device while maintaining or improving overall performance.

SUMMARY

Embodiments, of the inventive concept provide highly-reliable integrated circuit (IC) devices in which memory device(s) may be fabricated together with logic device(s).

According to an aspect of the inventive concept, an integrated circuit device may include; a source region arranged in an upper portion of a substrate, a pair of split gate structures respectively on opposing sides of the source region, wherein each of the pair of split gate structures includes a floating gate electrode layer and a control gate electrode layer disposed on the floating gate electrode layer, an erase gate structure between the pair of split gate structures on the source region and including an erase gate electrode layer, a pair of selection gate structures respectively on outer sidewalls of the pair of split gate structures, and a pair of gate spacers, wherein each of the gate spacers is disposed between one of the pair of split gate structures and one of the pair of selection gate structures, includes a first gate spacer and a second gate spacer disposed on the first gate spacer, is further disposed on an outer side wall of the one of the pair of split gate structures, and a lowermost end of the second gate spacer is at a lower level than an upper surface of the floating gate electrode layer.

According to another aspect of the inventive concept, an integrated circuit device may include; a source region arranged in an upper portion of a substrate, a split gate structure including a first split gate disposed to one side of the source region and a second split gate disposed to another side of the source region, wherein the first split gate includes a first floating gate electrode and a first control gate electrode on the first floating gate electrode, and the second split gate includes a second floating gate electrode and a second control gate electrode on the second floating gate electrode, an erase gate structure between the first split gate and the second split gate on the source region, including an erase gate electrode, and bounded by an erase gate insulating layer including a bottom surface, a first side surface, and a second side surface, a selection gate structure including a first selection gate on an outer side wall of the first split gate and a second selection gate on an outer side wall of the second split gate, a first capping layer covering the first control gate electrode and disposed on an outer side wall of the first side surface of the erase gate insulating layer, a second capping layer covering the second control gate electrode and disposed on an outer side wall of the second side surface of the erase gate insulating layer, a first capping element disposed on an inner side wall of the first side surface of the erase insulating layer to cover a first portion of the erase gate electrode, and a second capping element separated from the first caping element and disposed on an inner side wall of the second surface of the erase insulating layer to cover a second portion of the erase gate electrode, and a pair of gate spacers including a first spacer on an outer side wall of the first split gate and a second spacer on an outer side wall of the second split gate, wherein each of the first spacer and the second spacer includes a first gate spacer and a second gate spacer disposed on the first gate spacer, and a lowermost end of the second gate spacer is at a lower level than an upper surface of the floating gate electrode layer.

According to still another aspect of the inventive concept, an integrated circuit (IC) device may include a substrate including a memory cell region and a logic region, wherein a memory cell device is disposed in the memory cell region. The memory cell device may include; a pair of split gate structures separated by a split trench, wherein each of the pair of split gate structures includes a floating gate insulating layer, a floating gate electrode layer, a control gate insulating layer, and a control gate electrode layer sequentially stacked on the substrate, an erase gate structure filling at least a portion of the split trench and including an erase gate insulating layer and an erase gate electrode layer on the erase gate insulating layer, a gate capping layer covering an upper surface of the control gate electrode layer for each of the pair of split gate structures and an upper surface of the erase gate electrode layer, a pair of gate spacers, respectively including a first gate spacer including a first material and a second spacer covering the first gate spacer and including a second material different from the first material, wherein each of the pair of gate spacers covers outer side walls of the gate capping layer and outer side walls of one of the pair of split gate structures, a lowermost end of the first gate spacer contacts the floating gate insulating layer, and a lowermost end of the second gate spacer is at a level lower than an upper surface of the floating gate electrode layer and higher than a lower surface of the floating gate electrode layer, and a pair of selection gate structures, wherein each of the pair of selection gate structures includes a selection gate insulating layer including a high-k dielectric material and a selection gate electrode layer including at least one of a metal and a metal nitride, and is disposed on an outer side of one of the pair of split gate structures, such that one of the pair of gate spacers is interposed between one of the pair of selection gate structures and one of the pair of split gate structures. The IC device may also include a logic transistor in the logic region, wherein the logic transistor includes a gate electrode layer disposed on the substrate and a gate insulating layer between the substrate and the gate electrode layer, and the gate insulating layer has a same thickness and a same material as the selection gate insulating layer.

BRIEF DESCRIPTION OF THE DRAWINGS

The making and use of the inventive concept may be more clearly understood upon consideration of the following detailed description together with the accompanying drawings in which:

FIGS. 4A, 4B, 4C, 4D, 4E, 4F, 4G, 4H, 4I, 4J, 4K, 4L, 4M, 4N, 4O, 4P, 4Q and 4R (hereafter collectively, "FIGS. 4A to 4R") are related cross-sectional views illustrating a method of manufacturing an IC device including a memory cell device according to embodiments of the inventive concept;

DETAILED DESCRIPTION

Throughout the written description and drawings, like reference numbers and labels are used to denote like or similar components, elements and/or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom/side; higher/lower; closer/farther; thicker/thinner; proximate/distant; above/below; under/over; upper/lower; center/side; surrounding; overlay/underlay; etc.

Figure 1:
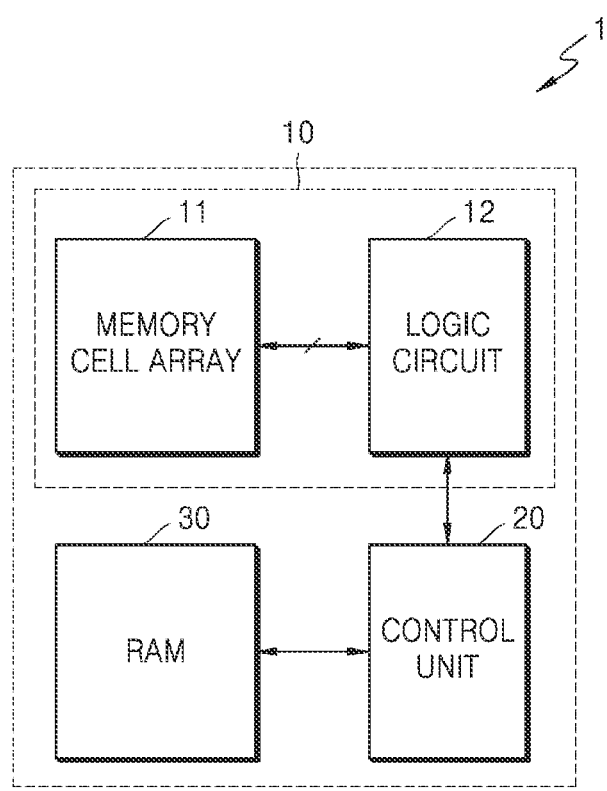
FIG. 1 is a block diagram illustrating an electronic device including an IC device according to embodiments of the inventive concept.

Figure (FIG. 1 is a block diagram illustrating an electronic device 1 including an integrated circuit (IC) device 10 according to embodiments of the inventive concept.

Referring to FIG. 1, the electronic device 1 may generally include in additional to the IC device 10, a control unit 20, and random access memory (RAM) 30. The IC device 10 may include a memory cell array 11 (wholly or partially implemented by memory cell device(s)) and a logic circuit 12 (wholly or partially implemented by logic device(s)). The memory cell array 11 may include memory blocks arranging memory cells associated with the memory cell device(s).

The logic circuit 12 may be used to control the execution (or performance) of various operations (e.g., reading data, writing (or programming) data and/or erasing data) in response to one or more command(s) provided by the control unit 20. In this regard, the control unit 20 may control the operation of the IC device 10 in response to a request received from a connected host device (not shown) in FIG. 1.

The control unit 20 together with the RAM 30 may implement functionality associated with a memory controller. Although omitted from FIG. 1 for clarity, the IC device 10 may variously include (e.g., as implemented in hardware and/or software) a host interface, a memory interface, error correcting code (ECC) circuitry, etc., in addition to the control unit 20 and the RAM 30.

Operation of the RAM 30 may be controlled by the control unit 20, wherein the RAM 30 may be used as a working memory, a buffer memory, a cache memory, etc. When used as a working memory, data to-be-processed by the control unit 20 may be temporarily stored in the RAM 30. When used as a buffer memory, the RAM 30 may buffer data (e.g., read data and/or write data) communicated (e.g., transmitted and/or received) between the host and the electronic device 1. When is used as a cache memory, the memory cell array 11 the RAM 30 may variously communicate data between slower data speed and faster data speed environments.

Figure 2:
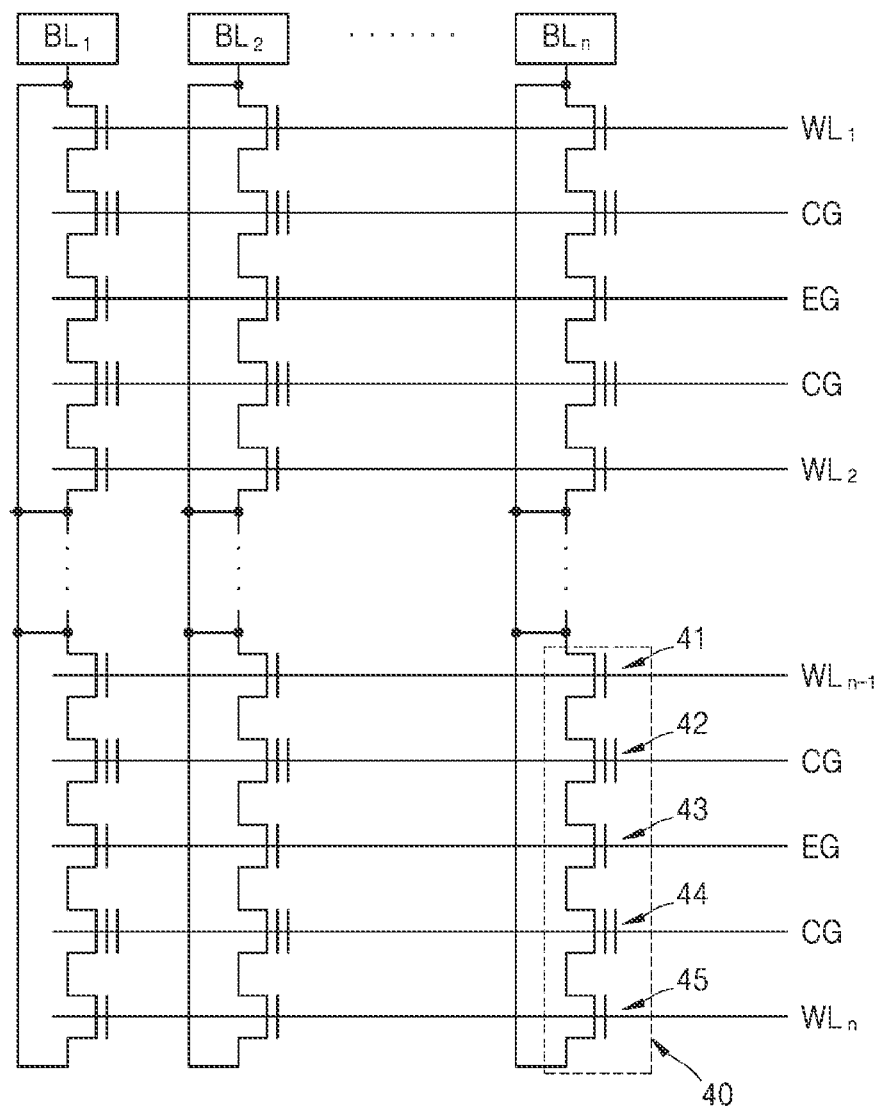
FIG. 2 is a partial circuit diagram illustrating a memory cell device that may be included in a memory cell array of an IC device according to embodiments of the inventive concept.

FIG. 2 is a circuit diagram illustrating in part a memory cell device that may be included in a memory cell array of the IC device 10.

Referring to FIG. 2, a memory cell device 40 may include a number of gate electrodes (e.g., selection gate electrode layers 41, 42, 43, 44 and 45) respectively connected to corresponding word lines (e.g., WL1 to WLn), control gate electrode layers 42 and 44 connected to control gate lines CG, and an erase gate electrode layer 43 connected to an erase gate line EG. Thus, the memory cell device 40 may be connected to two word lines WLs (e.g., WLn−1 and WLn) among the word lines WL1 to WLn, or one bit line BLn among bit lines BL1 to BLn.

Accordingly, the memory cell array 11 shown in FIG. 1 may be variously connected to the logic circuit 12 of FIG. 1 through 'n' word lines WL1 to WLn and 'm' bit lines BL1 to BLm, where 'n' and 'm' are natural numbers greater than 1. Here, the memory cell device 40 may include the selection gate electrode layers 41 and 45 connected to the word lines WL, the control gate electrode layers 42 and 44 connected to the control gate lines CG, and the erase gate electrode layer 43 connected to the erase gate line EG, etc. In some embodiments, the control gate electrode layers 42 and 44 may have a floating gate electrode structure.

AT least one memory cell device 40 may include a split gate structure that forms a symmetrical structure in relation to the erase gate electrode layer 43. Thus, in one memory cell device 40, the control gate electrode layers 42 and 44 and the selected gate electrode layers 41 and 45 may be disposed on side surfaces of the erase gate electrode layer 43, respectively.

Write operations may be executed on a bit-by-bit basis. During write operations in some embodiments, a voltage of about 9.0 V may be applied to the selected gate electrode layers 42 and 44 to provide coupling to a floating gate electrode at a lower part of the selected gate electrode layers 42 and 44, and 4.5 V corresponding to half of the 9.0 V may be applied to a source line and the erase gate electrode layer 43. A voltage of about 0.8 V may be applied to the word line WL, and a voltage of about 0.3 V or less may be applied to the bit line BL and currents of a few microamperes may flow through the bit line BL.

During erase operations in some embodiments, a voltage of about 9.5 V may be applied to the erase gate electrode layer 43 of the memory cell device 40, which is selected to erase the data. Thus, a negative voltage of −8.0 V may be applied to the selected gate electrode layers 42 and 44, so that electron tunneling may occur from the floating gate electrode located at the lower part of the select gate electrode layers 42 and 44, to the erase gate electrode layer 43.

Consistent with the foregoing teaching examples (e.g., relative high and low voltages), voltage values associated with operation the memory cell device 40 during write operations and erase operations may vary by design.

Figure 3:
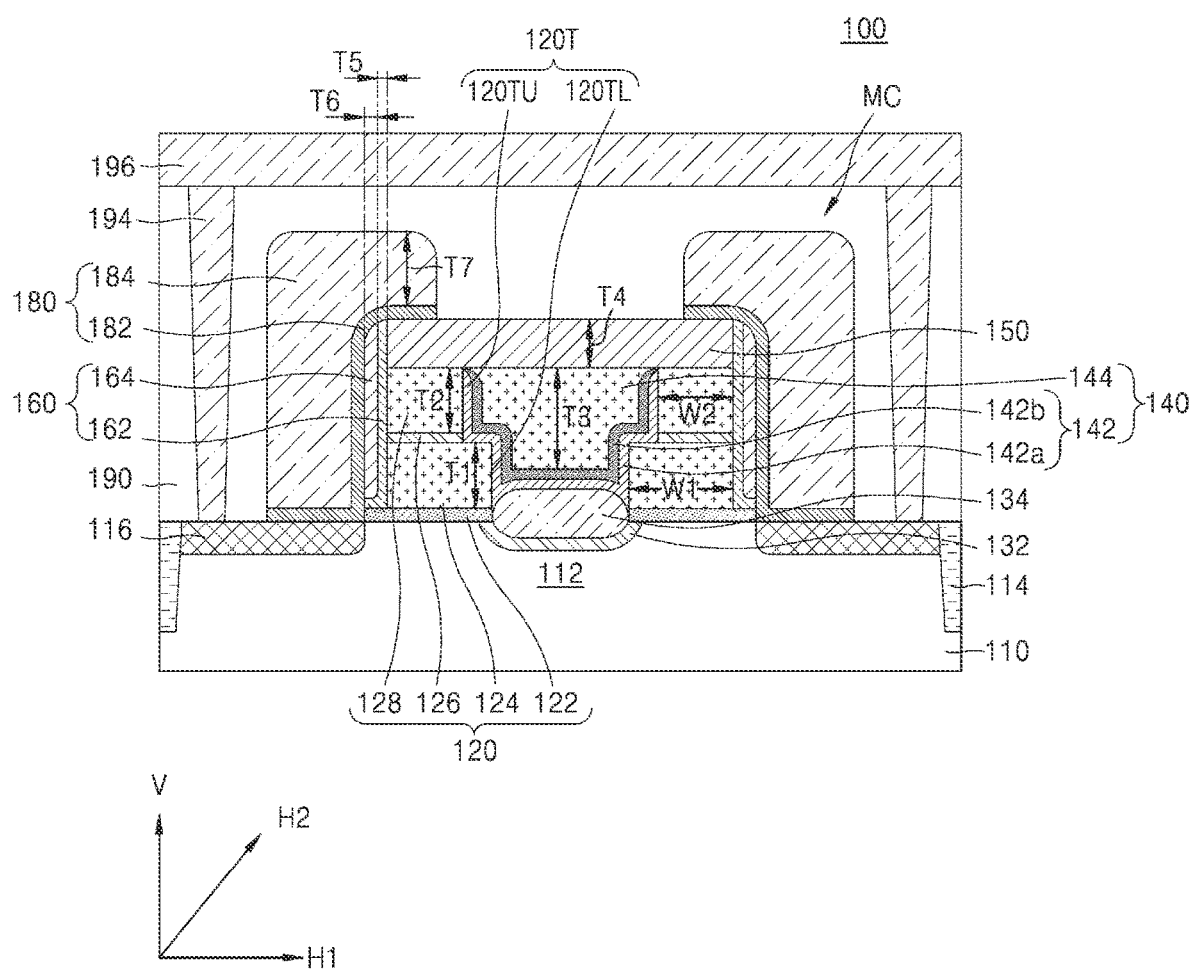
FIG. 3 is a cross-sectional view illustrating an IC device including a memory device according to embodiments of the inventive concept.

FIG. 3 is a cross-sectional view illustrating an IC device 100 including a memory device MC according to embodiments of the inventive concept.

Referring to FIG. 3, the memory cell device MC may be formed in a designated memory cell region MCR. (See, e.g., FIG. 10). The IC device 100 may include a substrate 110, and a split gate structure 120, an erase gate structure 140, and a selection gate structure 180 formed on the substrate 110. For example, one memory cell device MC may include a pair of split gate structures 120, the erase gate structure 140, and a pair of selection gate structures 180. The memory cell device MC may have a split gate shape in which the split gate structures 120 and the selection gate structures 180 are respectively disposed on both sides of the erase gate structure 140.

Here, the substrate 110 may include at least one semiconductor material such as Si, Ge, SiGe, SiC, GaAs, InAs, InP, etc. In some embodiments, the substrate 110 may include at least one of III-V group material(s) and IV group material (s). The III-V group material may include a binary compound, a ternary compound, or a quaternary compound which includes at least one III group element and at least one V group element. The substrate 110 may include a conductive region, for example, an impurity-doped well or an impurity-doped structure.

An active region 112 may be defined by a device isolation film 114 in the substrate 110. The device isolation film 114 may include, for example, a material including at least one of a silicon oxide film, a silicon nitride film, and a silicon oxynitride film. The device isolation film 114 may include a single layer including one type of insulating film, a double layer including two types of insulating films, or a multi-layer including a combination of at least three types of insulating films.

A first impurity region 116 may be formed in the active region 112 of the substrate 110. The first impurity region 116 may be disposed on an upper portion of the active region 112 in the substrate 110. In some embodiments, the first impurity region 116 may be formed by injecting impurities having the same conductivity as the active region 112 in order to have an impurity concentration greater than that of the active region 112. The device isolation film 114 may be disposed on the outside of the first impurity region 116 based on the memory cell device MC.

The split gate structure 120 may include a floating gate insulating layer 122, a floating gate electrode layer 124, a control gate insulating layer 126, and a control gate electrode layer 128, which are sequentially stacked on the substrate 110.

The floating gate insulating layer 122 may include, for example, silicon oxide. The floating gate electrode layer 124 may include, for example, polysilicon, metal, conductive metal nitride, conductive metal silicide, or combinations thereof. In some embodiments, the floating gate electrode layer 124 may include polysilicon doped with impurities. The floating gate electrode layer 124 may have a first thickness T1 (e.g., about 300 Å to about 500 Å).

The control gate insulating layer 126 may include, for example, silicon oxide. In some embodiments, the control gate insulating layer 126 may include silicon oxide, or a oxide-nitride-oxide (ONO) structure in which a silicon oxide film, a silicon nitride film, and a silicon oxide film are sequentially stacked. The control gate electrode layer 128 may include, for example, polysilicon, metal, conductive metal nitride, conductive metal silicide, or combinations thereof. In some embodiments, the control gate electrode layer 128 may include polysilicon doped with impurities (hereafter generically, "doped polysilicon"). The control gate electrode layer 128 may have a second thickness T2 (e.g., about 300 Å to about 500 Å). In some embodiments, the first thickness T1 and the second thickness T2 may be substantially the same. In some embodiments, the floating gate electrode 124 and the control gate electrode layer 128 may include at least one same material.

The pair of split gate structures 120 may be spaced apart and may each include a split trench 120T. The split trench 120T may include a lower split trench 120TL and a vertically proximate upper split trench 120TU. The lower split trench 120TL may be disposed in a space between a pair of stacked structures of the floating gate insulating layer 122 and the floating gate electrode layer 124, and the upper split trench 120TU may be disposed in a space between a pair of stacked structures of the control gate insulating layer 126 and the control gate electrode layer 128. A "width" (e.g., a dimension measured in a first horizontal direction H1 substantially parallel to upper and lower surfaces of the substrate 110) of the lower split trench 120TL may be less than a width of the upper split trench 120TU.

Outer side walls of the floating gate electrode layer 124, the control gate insulating layer 126, and the control gate electrode layer 128 among the pair of split gate structures 120 may be substantially aligned with each other in a vertical direction V (hereafter, "vertically aligned") in relation to the split trench 120T. Within the pair of split gate structures 120, inner side walls of the floating gate insulating layer 122 and the floating gate electrode layer 124 may be vertically aligned, and inner side walls of the control gate insulating layer 126 and the control gate electrode layer 128 may be vertically aligned in relation to the split trench 120T.

However, the inner side walls of the floating gate insulating layer 122 and the floating gate electrode layer 124 may not be vertically aligned with the inner side walls of the control gate insulating layer 126 and the control gate electrode layer 128. Indeed, the inner side walls of the floating gate insulating layer 122 and the floating gate electrode layer 124 may protrude inwardly (e.g., towards the split trench 120T) from the inner side walls of the control gate insulating layer 126 and the control gate electrode layer 128 in the first horizontal direction H1. The outer side wall of the floating gate insulating layer 122 may protrude outwardly (e.g., away from the split trench 120T) in the first horizontal direction H1 from the outer side walls of the floating gate electrode layer 124, the control gate insulating layer 126, and the control gate electrode layer 128. In some embodiments, the floating gate insulating layer 122 may extend from between the substrate 110 and the floating gate electrode layer 124 to between the substrate 110 and a gate spacer 160.

Accordingly, a first width W1 of the floating gate electrode layer 124 may be different from a second width W2 of the control gate electrode layer 128. For example, the first width W1 may be greater than the second width W2. Further, a width of the floating gate insulating layer 122 may be greater than the first width W1 (or the width of the floating gate electrode layer 124). And a width of the control gate insulating layer 126 may substantially be the same as the second width W2 (or the width of the control gate electrode layer 128).

In the pair of split gate structures 120, the inner side walls of the floating gate insulating layer 122 and the floating gate electrode layer 124 may not be vertically aligned with the inner side walls of the control gate insulating layer 126 and the control gate electrode layer 128 in relation to the split trench 120T.

A second impurity region 132 may be formed in an upper part of the active region 112 of the substrate 110 between the pair of split gate structures 120. The second impurity region 132 may be referred to as a "source region." For example, the second impurity region 132 may provide the source region associated with the memory cell device MC. In some embodiments, the second impurity region 132 may be formed by injecting impurities having conductivity different from the conductivity type of the active region 112. In some embodiments, the second impurity region 132 may have an upper surface characterized by a concave shape. That is, an upper surface of the active region 112 of the substrate 110, in which the second impurity region 132 is arranged, may have a concave shape.

A support insulator layer 134 may be disposed on the second impurity region 132. For example, the support insulator layer 134 may include silicon oxide. In some embodiments, the support insulator layer 134 may be formed by being grown on a portion of the substrate 110 exposed between the pair of split gate structures 120 via a thermal oxidation process. In the support insulator layer 134, a "height" (e.g., a dimension measured in the vertical direction V) of an inner side portion of the support insulator layer 134 may be greater than a height of an outer side portion thereof. That is, the support insulator layer 134 may have a convex shape including a central portion with greater height. For example, the support insulator layer 134 may have a convex shape in which an upper surface thereof protrudes upward and a lower surface thereof protrudes downward.

The erase gate structure 140 may be substantially disposed on the support insulator layer 134. The erase gate structure 140 may fill at least a portion of the split trench 120T. In some embodiments, the erase gate structure 140 may entirely fill the split trench 120T. The erase gate structure 140 may include an erase gate insulating layer 142 that covers an inner surface of the split trench 120T (e.g., a bottom surface and a side surface of the split trench 120T) and an erase gate electrode layer 144 substantially disposed on the erase gate insulating layer 142 to fill at least a portion of the split trench 120T.

Thus, the erase gate insulating layer 142 may cover inner side walls of the pair of split gate structures 120 exposed by the split trench 120T, as well as the upper surface of the support insulator layer 134. In some embodiments, the erase gate insulating layer 142 may be a stacked structure including a first erase gate insulating layer 142a and a second erase gate insulating layer 142b dispose don and covering the first erase gate insulating layer 142a.

The first erase gate insulating layer 142a may include silicon oxide or a material having a dielectric constant higher than that of silicon oxide (e.g., a high-k dielectric material). In some embodiments, the first erase gate insulating layer 142a may have a thickness of several tens to hundreds of angstroms (Å). When the first erase gate insulating layer 142a is formed of the material having a dielectric constant higher than that of silicon oxide, the first erase gate insulating layer 142a may include at least one material selected from, for example, hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconate titanate (PZT), strontium bismuth tantalate (STB), bismuth iron oxide (BFO), strontium titanium oxide (SrTiO), yttrium oxide (YO), aluminum oxide (AlO), and lead scandium tantalum oxide (PbScTaO). The second erase gate insulating layer 142b may include silicon oxide. The second erase gate insulating layer 142b may have a thickness of several tens angstroms (Å).

The erase gate electrode layer 144 may cover the second erase gate insulating layer 142b. The erase gate electrode layer 144 may include, for example, polysilicon, metal, conductive metal nitride, conductive metal silicide, or combinations thereof. In some embodiments, the erase gate electrode layer 144 may include polysilicon doped with impurities. The erase gate electrode layer 144 may have a third thickness T3 (e.g., about 400 Å to about 800 Å).

An upper surface of the erase gate electrode layer 144 may be disposed at the same "level" (e.g., a position measured in relation to the vertical direction V relative to an arbitrarily selected horizontal surface) as an upper surface of the control gate electrode layer 128. And a lower surface of the erase gate electrode layer 144 may be at a lower level than a lower surface of the control gate electrode layer 128. In some embodiments, the lower surface of the erase gate electrode layer 144 may be at a lower level than an upper surface of the floating gate electrode layer 124 and may be at a higher level than a lower surface of the floating gate electrode layer 124. The third thickness T3 may be greater than the first thickness T1 and the second thickness T2, respectively.

A gate capping layer 150 may cover the pair of split gate structures 120 and the erase gate structures 140 between the pair of split gate structures 120 together. The gate capping layer 150 may cover both the upper surface of the control gate electrode layer 128 of each of the pair of split gate structures 120 and the upper surface of the erase gate electrode layer 144. In some embodiments, both side walls of the gate capping layer 150 may be vertically aligned with the outer side wall of each of the floating gate electrode layer 124, the control gate insulating layer 126, and the control gate electrode layer 128 among the pair of split gate structures 120. In some embodiments, the gate capping layer 150 may include silicon nitride. The gate capping layer 150 may have a fourth thickness T4 (e.g., about 200 Å to about 400 Å). In some embodiments, the fourth thickness T4 of the gate capping layer 150 may be less than the first thickness T1 of the floating gate electrode 124 and the second thickness T2 of the control gate electrode layer 128.

A pair of gate spacers 160 may cover the outer side walls of each of the floating gate electrode layer 124, the control gate insulating layer 126, and the control gate electrode layers 128 among the pair of split gate structures 120 and may cover both side walls of the gate capping layer 150 together. That is, one of the pair of gate spacers 160 may cover the outer side walls of each of the floating gate electrode layer 124, the control gate insulating layer 126, and the control gate electrode layers 128 of one of the pair of split gate structures 120 and may cover one of both side walls of the gate capping layer 150, and the other of the pair of gate spacers 160 may also cover the outer side walls of each of the floating gate electrode layer 124, the control gate insulating layer 126, and the control gate electrode layers 128 of the other of the pair of split gate structures 120 and may cover the other of both side walls of the gate capping layer 150. The gate spacer 160 may contact the outer side walls of each of the floating gate electrode layer 124, the control gate insulating layer 126, the control gate electrode layer 128, and the side wall of the gate capping layer 150, and may contact a portion of the upper surface of the floating gate insulating layer 122.

Each of the pair of gate spacers 160 may have a stacked structure including a first gate spacer 162 and a second gate spacer 164 disposed on the first gate spacer 162. The first gate spacer 162 may include a material different from that of the second gate spacer 164. In some embodiments, the first gate spacer 162 may include silicon oxide, and the second gate spacer 164 may include silicon nitride.

The first gate spacer 162 may have an L shape with substantially the same thickness contacting the side walls of each of the gate capping layer 150, the control gate electrode layer 128, the control gate insulating layer 126, and the floating gate electrode layer 124, and the portion of the upper surface of the floating gate insulating layer 122, and extending along the side walls of each of the gate capping layer 150, the control gate electrode layer 128, the control gate insulating layer 126, and the floating gate electrode layer 124, and the portion of the upper surface of the floating gate insulating layer 122, and the second gate spacer 164 may have an I shape with substantially the same thickness. A portion of the first gate spacer 162 that covers the side walls of each of the gate capping layer 150, the control gate electrode layer 128, the control gate insulating layer 126, and the floating gate electrode layer 124 may be referred to as a vertical part, and a portion of the first gate spacer 162 that covers the portion of the upper surface of the floating gate insulating layer 122 and is connected to the vertical part may be referred to as a horizontal part. The second gate spacer 164 may cover an upper surface of the horizontal part of the first gate spacer 162 and may vertically extend along an outer side wall of the vertical part.

The first gate spacer 162 may have a fifth (overlaying) thickness T5 (e.g., about 10 Å to about 100 Å) and the second gate spacer 164 may have a sixth (overlaying) thickness T6 (e.g., about 100 Å to about 150 Å), wherein the sixth thickness T6 is greater than the fifth thickness T5. In this regard, each of the fifth thickness T5 and the sixth thickness T6 denotes an overlaying material(s) thickness regardless of relative vertical and/or horizontal (hereafter, "vertical/horizontal") orientation.

In some embodiments, a lowermost end of the gate spacer 160 may be at the same level as a lower surface of the floating gate electrode layer 124 and the upper surface of the floating gate insulating layer 122. For example, a lowermost end of the first gate spacer 162 may be at the same level as the lower surface of the floating gate electrode layer 124 and the upper surface of the floating gate insulating layer 122, and a lowermost end of the second gate spacer 164 may be at a higher level than the lower surface of the floating gate electrode layer 124 and the upper surface of the floating gate insulating layer 122 and at a lower level than the upper surface of the floating gate electrode layer 124. For example, the lowermost end of the first gate spacer 162 may contact the upper surface of the floating gate insulating layer 122, and the lowermost end of the second gate spacer 164 may be spaced apart from the floating gate insulating layer 122 with the first gate spacer 162 interposed therebetween. An uppermost end of the gate spacer 160 may be at the same level as the upper surface of the gate capping layer 150.

The pair of selection gate structures 180 may be disposed on the outside of the pair of split gate structures 120. The pair of selection gate structures 180 may have the pair of gate spacers 160 therebetween and may be disposed on the outside of the pair of split gate structures 120. The selection gate structure 180 may cover a portion of the substrate 110 on the outside of each of the pair of split gate structures 120 and the gate spacer 160 and may extend to a portion of the upper surface of the gate capping layer 150. In some embodiments, the selection gate structure 180 may "overlap" (e.g., be vertically disposed in relation to at least a portion thereof) the first impurity region 116. The selection gate structure 180 may entirely overlap the gate spacer 160. The selection gate structure 180 may overlap the split gate structure 120. For example, the selection gate structure 180 may overlap an outer portion of the split gate structure 120, but may not overlap an inner portion thereof. The selection gate structure 180 may not overlap the control gate structure 140.

The selection gate structure 180 may include a stacked structure including a selection gate insulating layer 182 and a selection gate electrode layer 184 covering the selection gate insulating layer 182. The selection gate insulating layer 182 may conformally cover a portion of the upper surface of the substrate 110 (e.g., the portion overing a portion of the upper surface of the first impurity region 116, a side surface and the upper surface of the gate spacer 160, and a portion of the upper surface of the gate capping layer 150). The selection gate insulating layer 182 and the selection gate electrode layer 184 may overlap each other.

An upper surface of the selection gate structure 180, that is, the upper surface of the selection gate electrode layer 184, may be at a higher level than the upper surface of the gate capping layer 150. On the upper surface of the gate capping layer 150, the selection gate electrode layer 184 may have a seventh thickness T7 (e.g., about 400 Å to about 700 Å). In some embodiments, the seventh thickness T7 may be greater than the first thickness T1 and the second thickness T2, respectively. In this regard, for example, the seventh thickness T7 may be measured from the upper surface selection gate insulating layer 182 in relation to the material(s) layer forming the selection gate electrode layer 184.

Such material(s) forming the selection gate electrode layer 184 may include, for example, a material having a dielectric constant higher than silicon oxide (e.g., a high-k dielectric material). In some embodiments, the selection gate insulating layer 182 may include metal oxide or metal oxynitride. For example, the selection gate insulating layer 182 may have a dielectric constant of about 10 to about 25. In some embodiments, the selection gate insulating layer 182 may include at least one material selected from, for example, hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the selection gate insulating layer 182 may include $HfO_2$, $Al_2O_3$, $HfAlO_3$, $Ta_2O_3$, or $TiO_2$.

In some other embodiments, the select gate insulating layer 182 may include a stacked structure of an interface film including silicon oxide and at least one material selected from the high-k dielectric material and a ferroelectric material.

The selection gate electrode layer 184 may include a metal layer and/or a metal nitride layer including for example, at least one metal such as, for example, Ti, Ta, W, Ru, Nb, Mo, and Hf.

An interlayer insulating film 190 may be formed on the memory cell device MC. The interlayer insulating film 190 may include silicon oxide. For example, the interlayer insulating film 190 may include a high density plasma (HDP) oxide film or a tetra ethyl ortho silicate (TEOS) oxide film. A bit line 196 may be disposed on the interlayer insulating film 190. The bit line 196 may be electrically connected to the first impurity region 116. A bit line contact 194 may penetrate the interlayer insulating film 190 to electrically connect the bit line 196 to the first impurity region 116. The bit line contact 194 and the bit line 196 may include metal, or metal nitride.

Figure 4A:
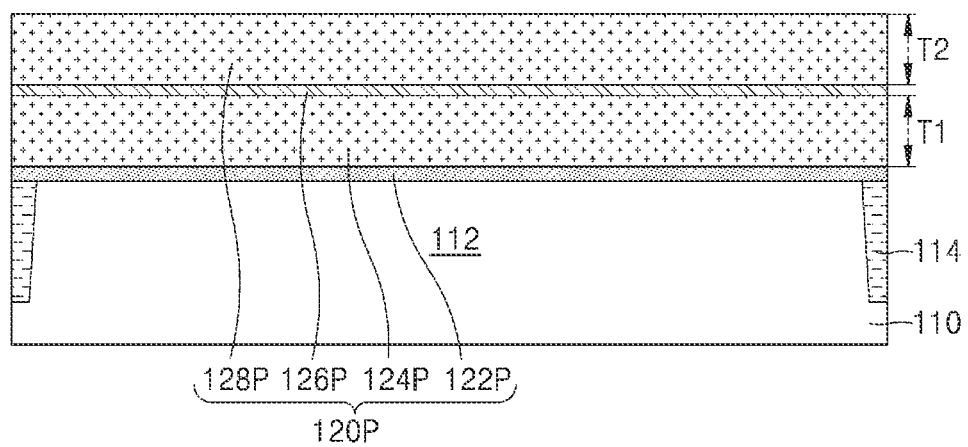
Figure 4B:
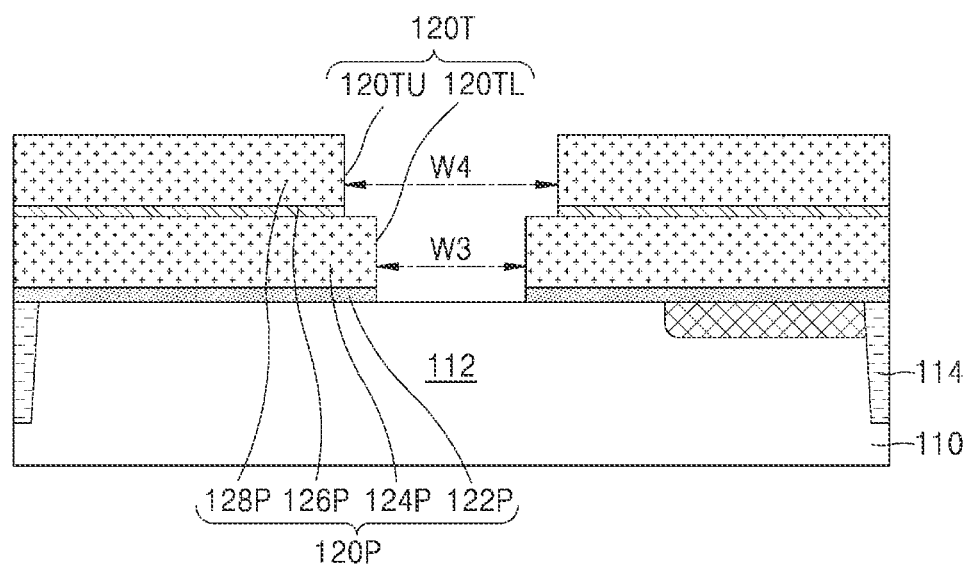
Figure 4C:
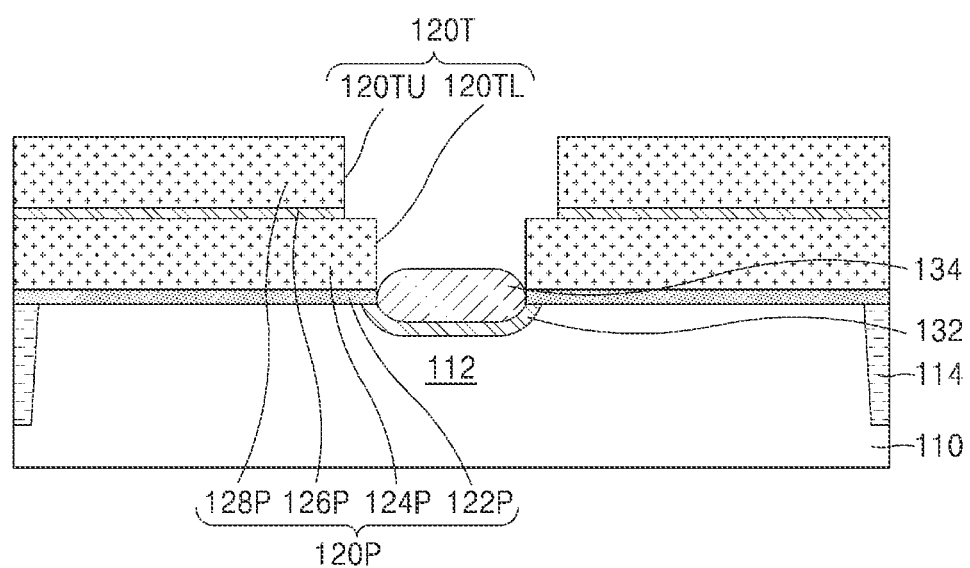
Figure 4D:
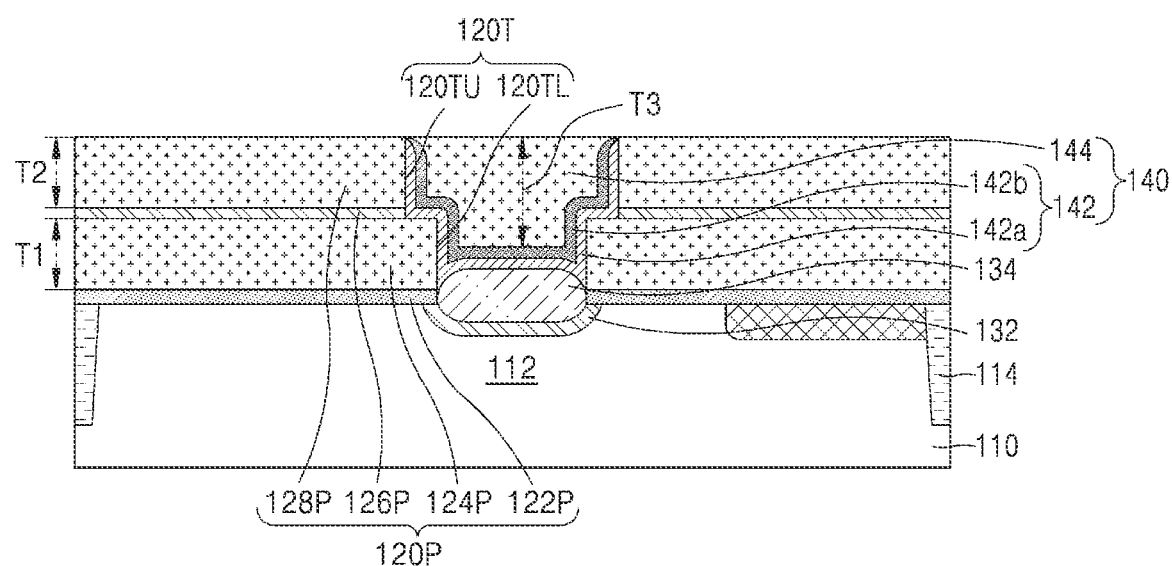
Figure 4E:
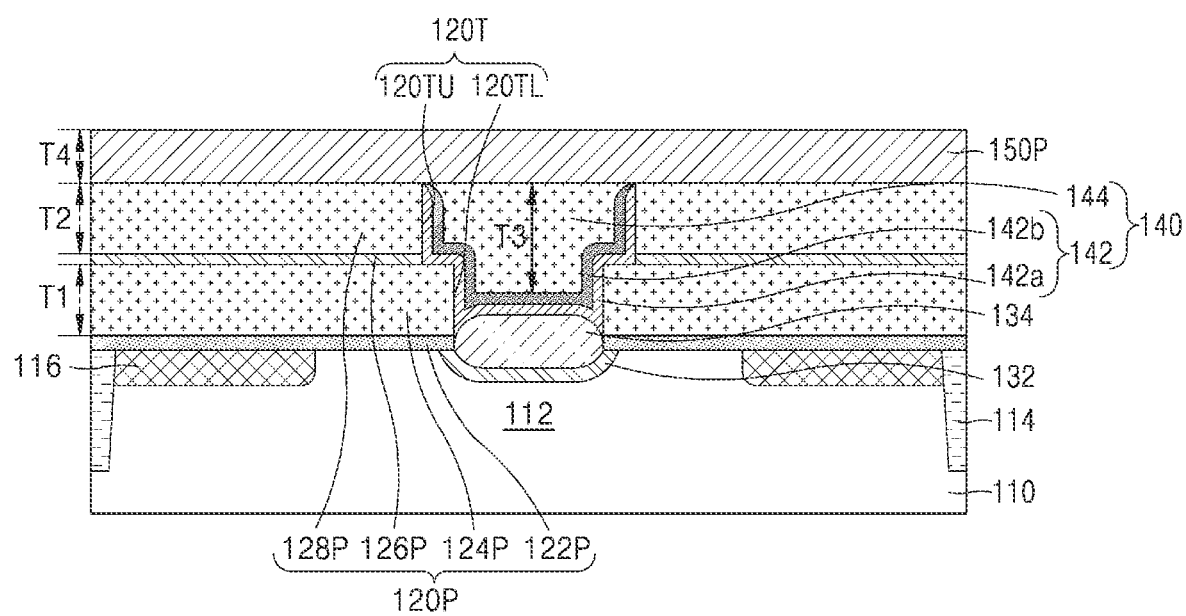
Figure 4F:
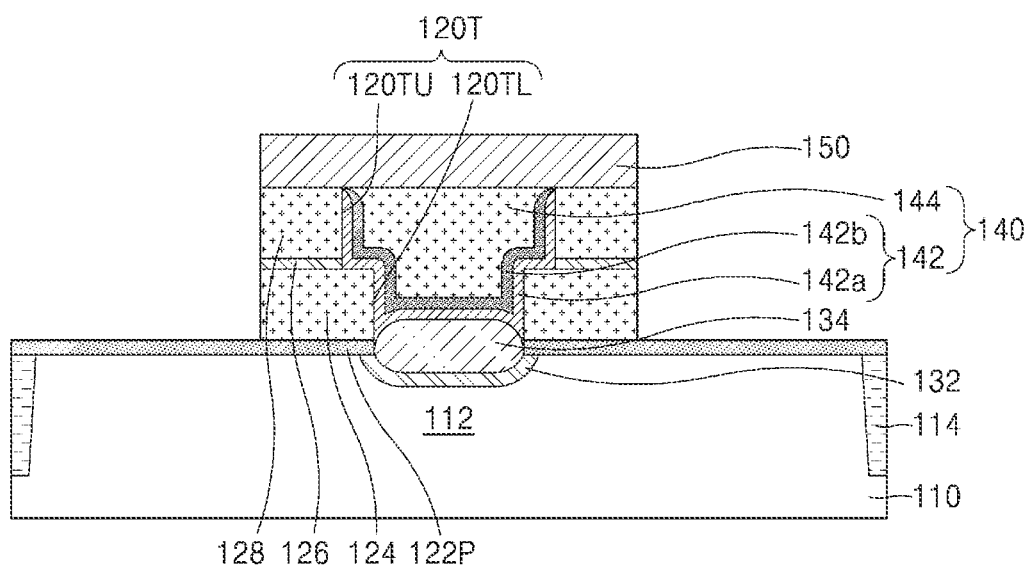
Figure 4G:
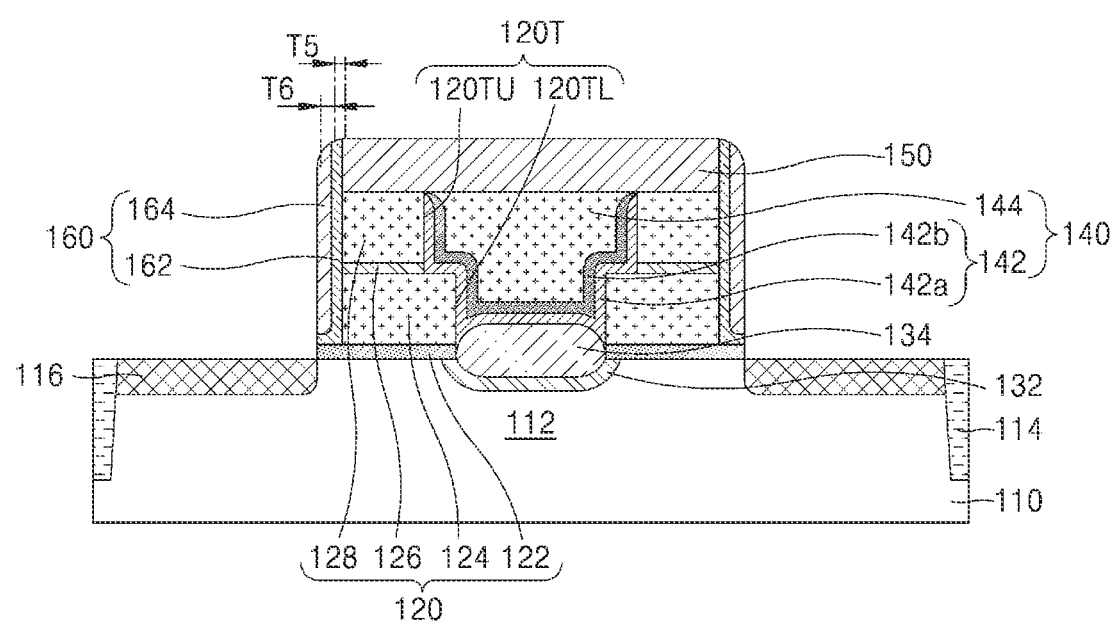
Figure 4H:
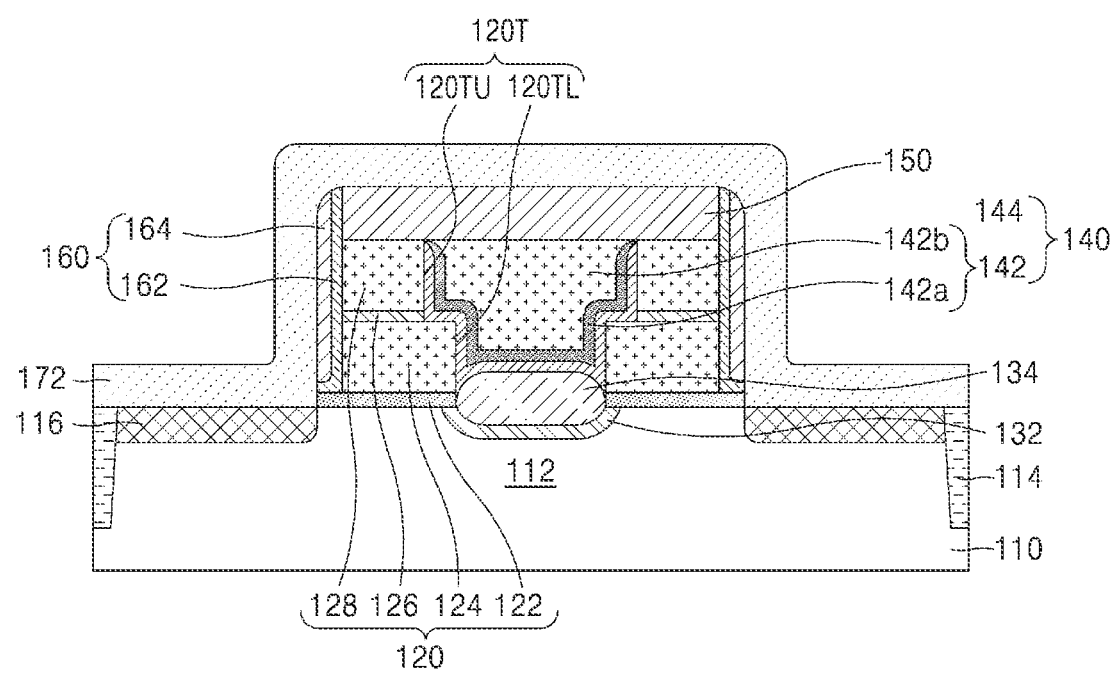
Figure 4I:
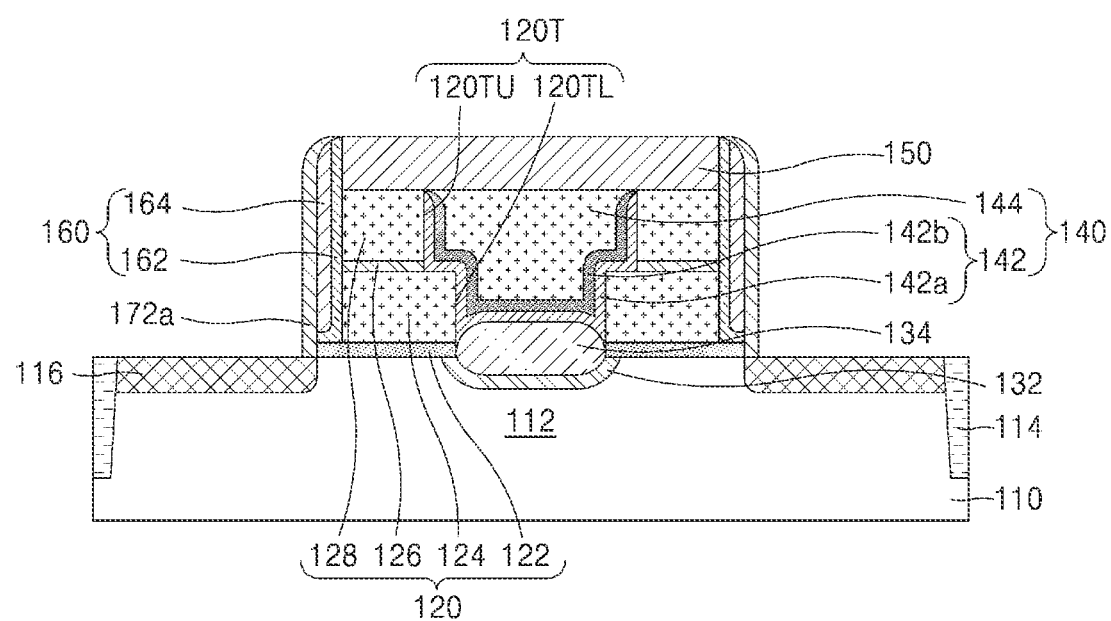
Figure 4J:
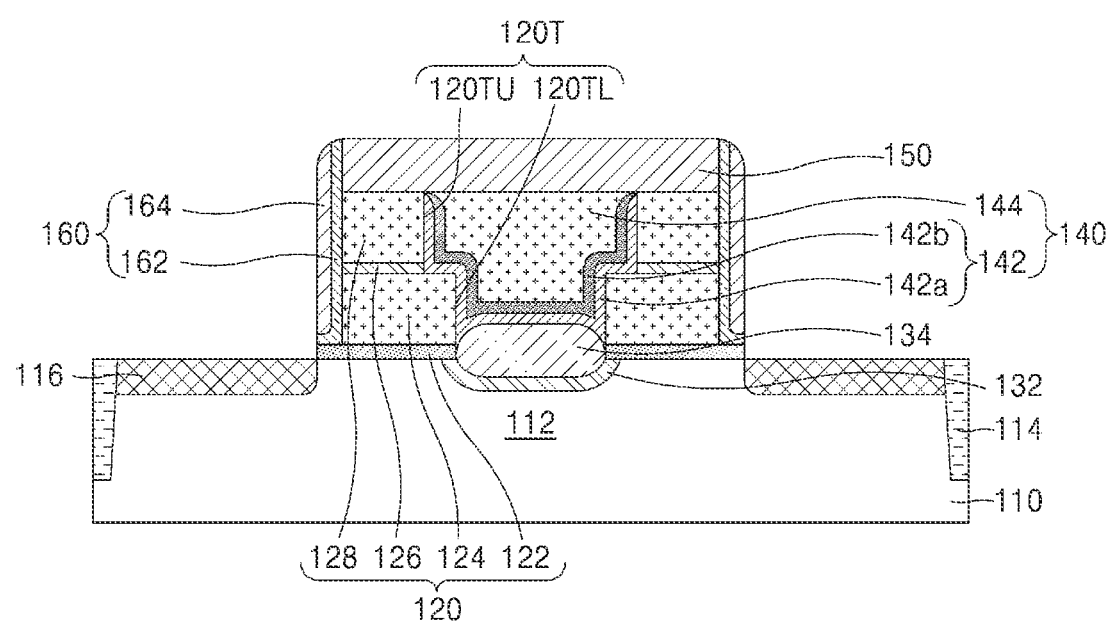
Figure 4K:
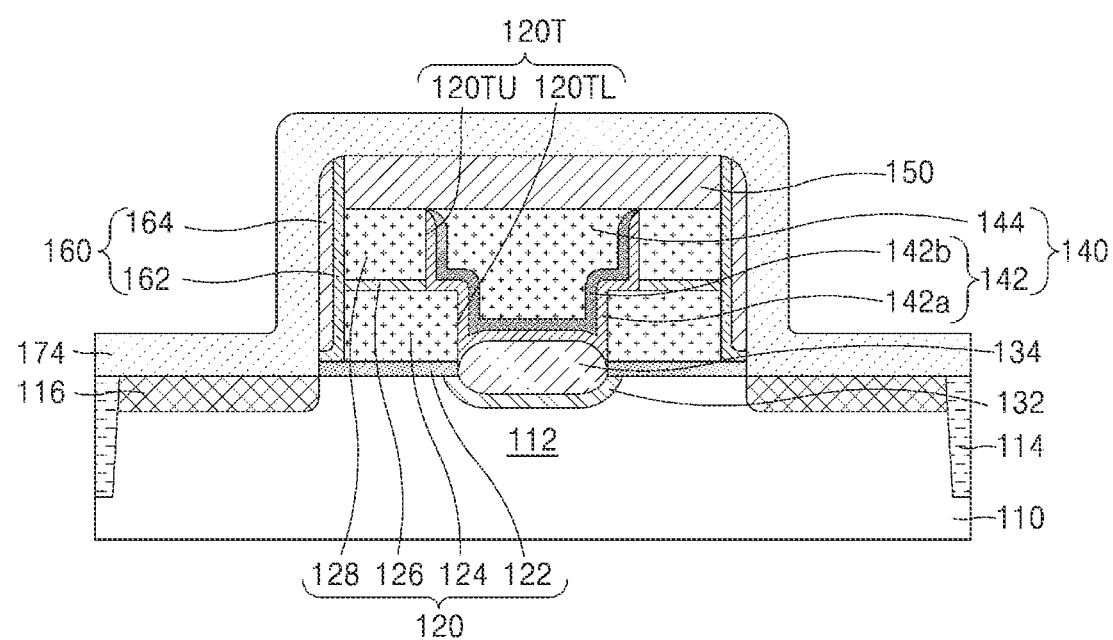
Figure 4L:
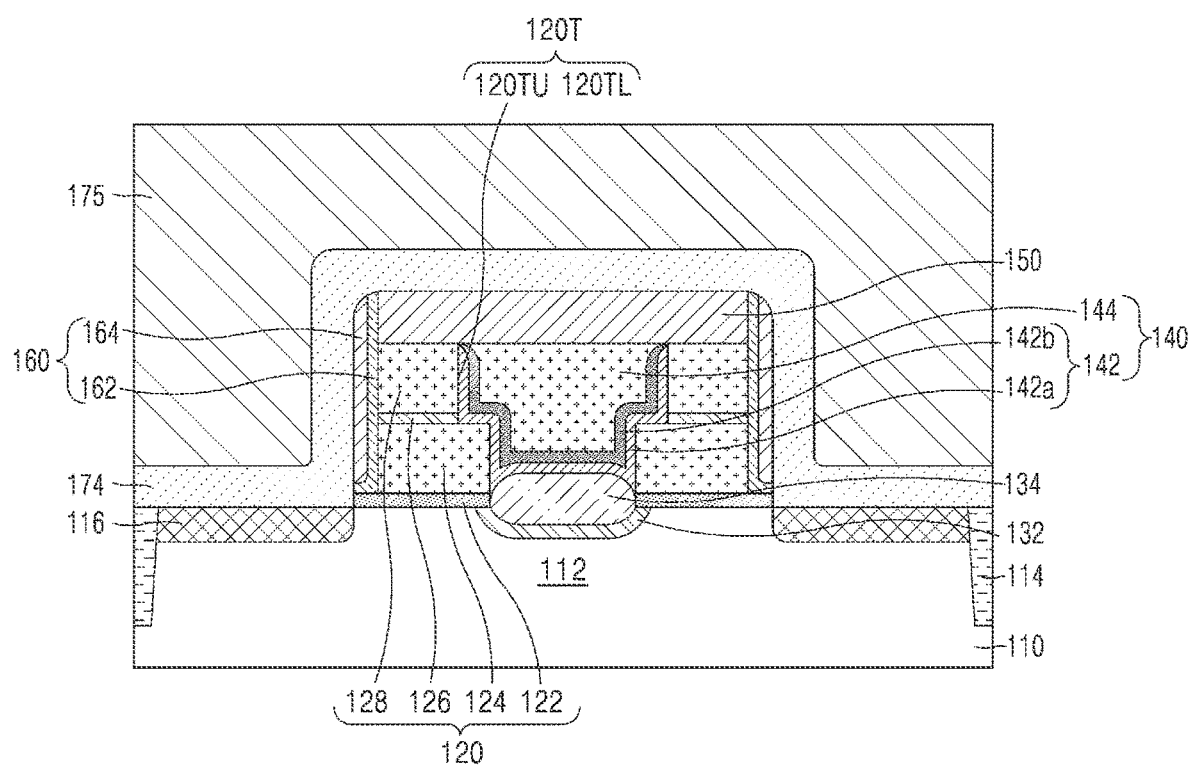
Figure 4M:
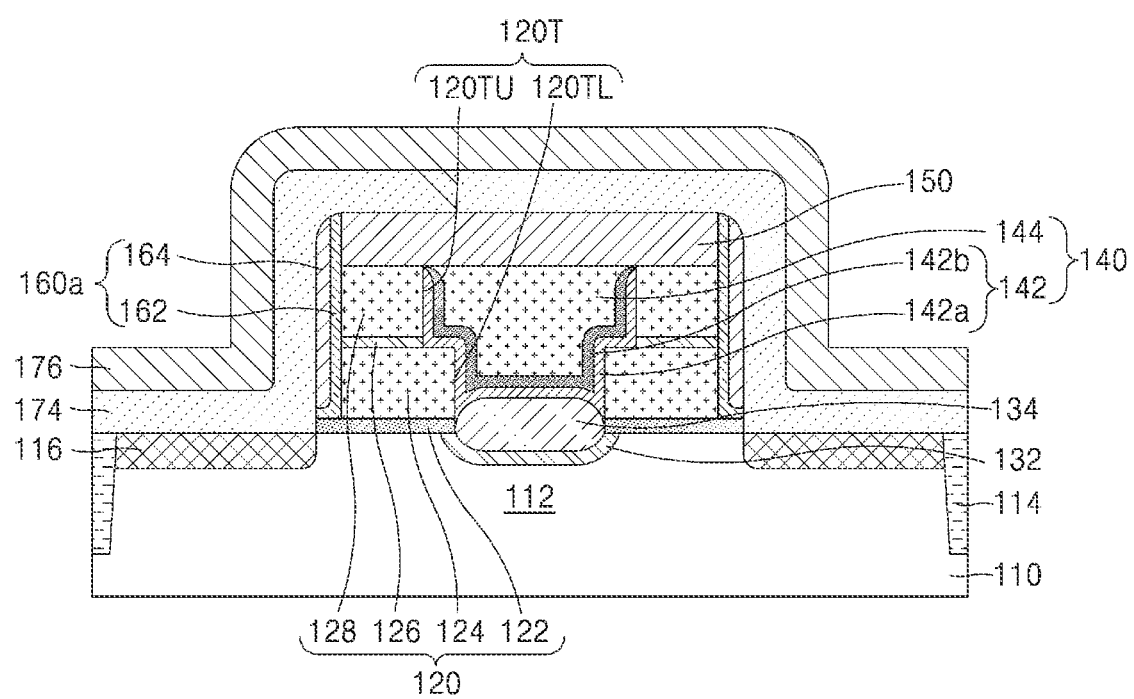
Figure 4N:
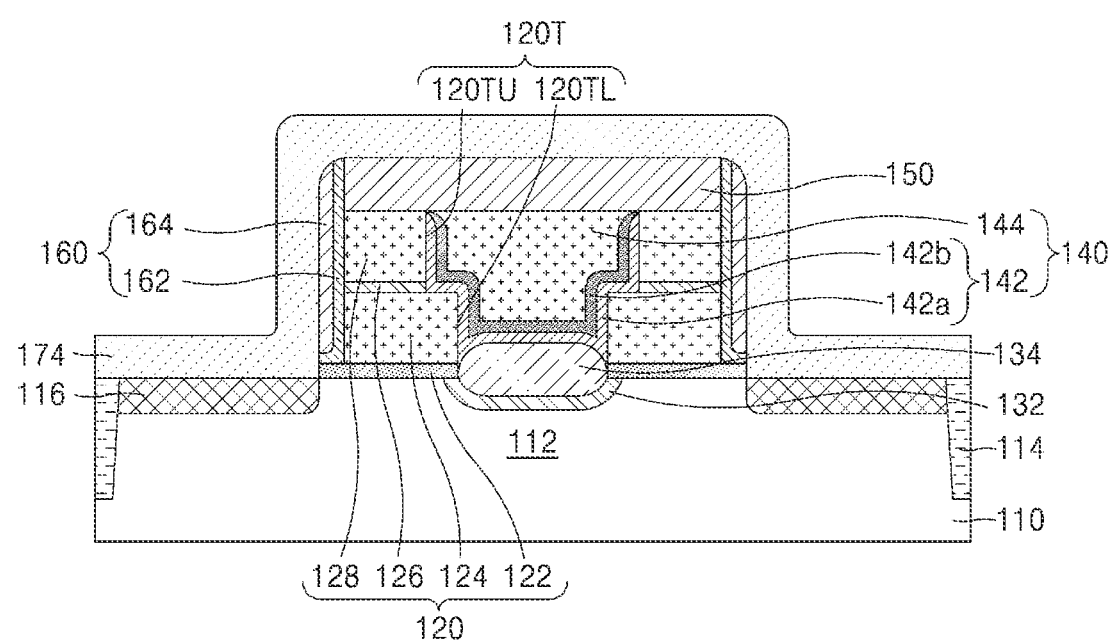
Figure 40:
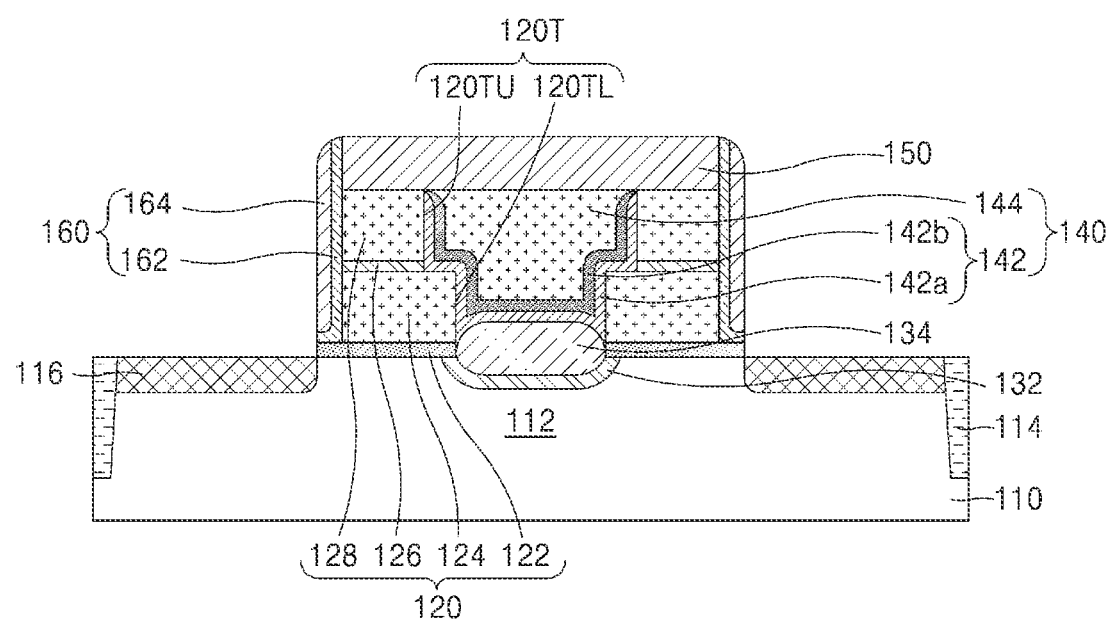
Figure 4P:
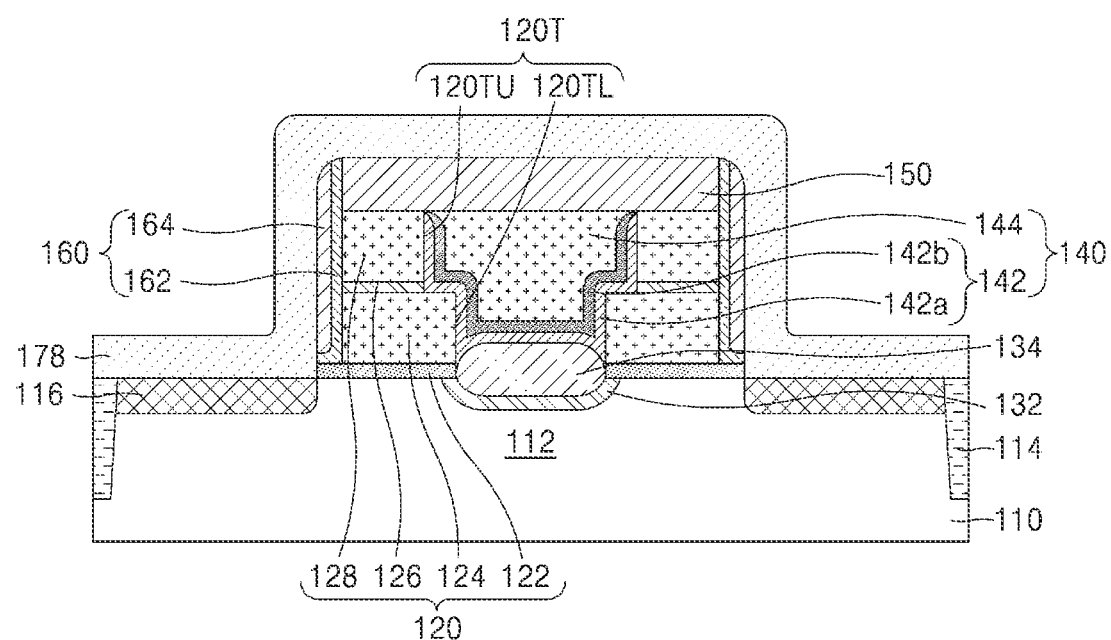
Figure 4Q:
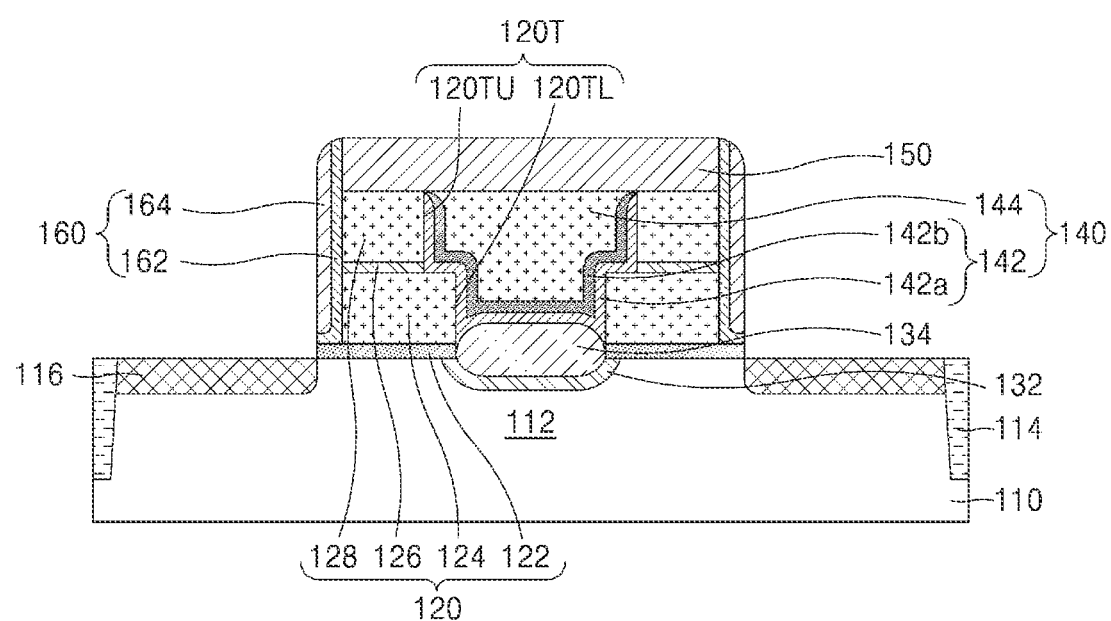
Figure 4R:
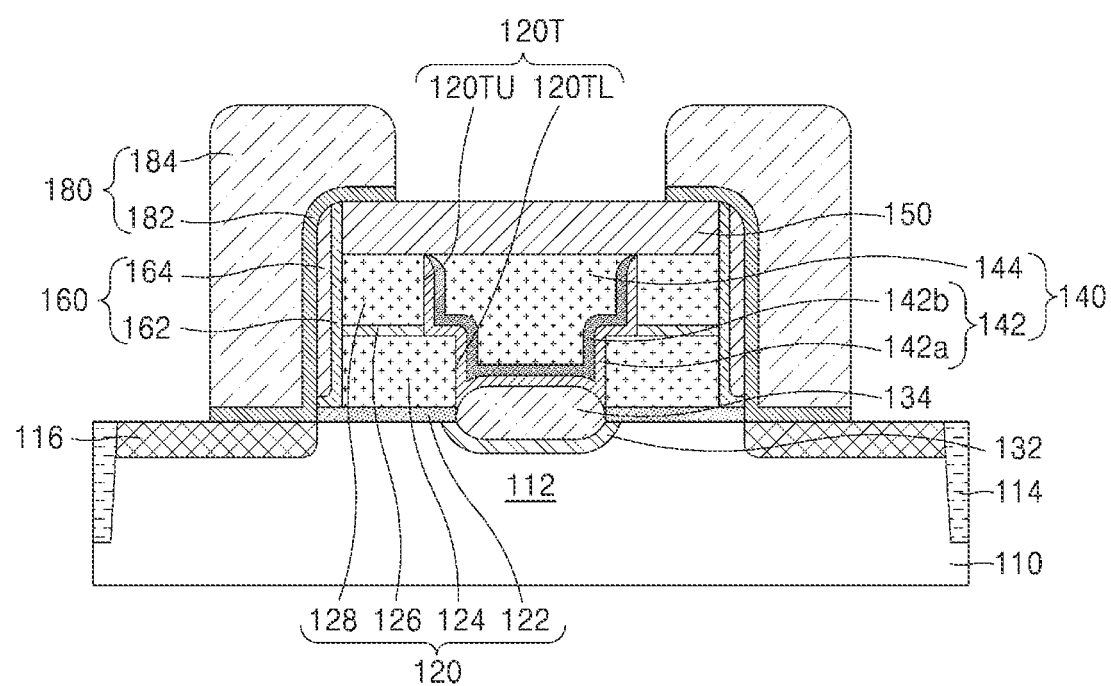

FIGS. 4A to 4R are related cross-sectional views illustrating a method of manufacturing the IC device 100 of FIG. 3 including a memory cell device according to embodiments of the inventive concept.

Referring to FIG. 4A, the device isolation film 114 for defining the active region 112 in the substrate 110 may be formed. The device isolation film 114 may extend from the upper surface of the substrate 110 toward the inside thereof. The device isolation film 114 may be formed by removing a portion of the substrate 110 to form an isolation trench extending from the upper surface of the substrate 110 toward the inside thereof, and then filling insulating material in the isolation trench.

By sequentially forming a preliminary floating insulating layer 122P, a preliminary floating electrode layer 124P, a preliminary control insulating layer 126P, and a preliminary control electrode layer 128P on the substrate 110, a preliminary split stacked structure 120P including the preliminary floating insulating layer 122P, the preliminary floating electrode layer 124P, the preliminary control insulating layer 126P, and the preliminary control electrode layer 128P may be formed.

The preliminary floating electrode layer 124P may be formed to have the first thickness T1, and the preliminary control electrode layer 128P may be formed to have the second thickness T2. In some embodiments, the first thickness T1 and the second thickness T2 may be substantially the same (e.g., about 300 Å to about 500 Å).

The preliminary floating insulating layer 122P may be formed to include, for example, silicon oxide. The preliminary floating electrode layer 124P may be formed to include polysilicon doped with impurities. The preliminary control insulating layer 126P may be formed to include, for example, silicon oxide. The preliminary control electrode layer 128P may be formed to include polysilicon doped with impurities.

Referring to FIG. 4B, a portion of the preliminary split stacked structure 120P may be removed to form the split trench 120T for exposing the active region 112 of the substrate 110. The split trench 120T may include the lower split trench 120TL and the upper split trench 120TU that communicate with each other. The lower split trench 120TL may be formed to have a third width W3. The upper split trench 120TU may be formed to have a fourth width W4. In some embodiments, the third width W3 may be less than the fourth width W4.

In some embodiments, the split trench 120T may be formed by first performing a first etching process for forming the upper split trench 120TU by removing portions of the preliminary control electrode layer 128P and the preliminary control insulating layer 126P, and then performing a second etching process for forming the lower split trench 120TL by removing portions of the preliminary floating electrode layer 124P and the preliminary floating insulating layer 122P.

Referring to FIG. 4C, impurities may be introduced (e.g. injected) into a portion of the active region 112 of the substrate 110 that is exposed at a bottom surface of the split trench 120T to form the second impurity region 132, and the portion of the active region 112 of the substrate 110 may be oxidized to form the support insulator layer 134.

In some embodiments, the second impurity region 132 may be formed by introducing impurities having a conductivity type different from that of the active region 112. In some embodiments, the support insulator layer 134 may be formed by oxidizing the portion of the active region 112 of the substrate 110 via the thermal oxidation process. For example, the support insulator layer 134 may be formed to have a bird's beak shape in which the central portion thereof is convex and an outer portion thereof is thin. The upper surface of the second impurity region 132 may be formed to have a concave shape corresponding to a convex shape of the support insulator layer 134.

Referring to FIG. 4D, the erase gate insulating layer 142 covering the inner surface of the split trench 120T and the erase gate electrode layer 144 filling the split trench 120T and covering the erase gate insulating layer 142 may be formed. The erase gate insulating layer 142 and the erase gate electrode layer 144 may constitute the erase gate structure 140. The erase gate insulating layer 142 may be formed to cover inner side walls of each of the preliminary floating insulating layer 122P, the preliminary floating electrode layer 124P, the preliminary control insulating layer 126P, and the preliminary control electrode layer 128P, and the upper surface of the support insulator layer 134, which are exposed in the split trench 120T.

In some embodiments, the erase gate insulating layer 142 may be the stacked structure including the first erase gate insulating layer 142a and the second erase gate insulating layer 142b covering the first erase gate insulating layer 142a. The first erase gate insulating layer 142a may be formed to conformally cover the inner side wall of the split trench 120T and the upper surface of the support insulator layer 134, and the second erase gate insulating layer 142b may be formed to conformally cover the first erase gate insulating layer 142a. The erase gate electrode layer 144 may be formed to cover the second erase gate insulating layer 142b and fill the split trench 120T.

For example, the erase gate electrode layer 144, the second erase gate insulating layer 142b, and the first erase gate insulating layer 142a may be formed by sequentially forming a first preliminary erase insulating layer covering the upper surface of the preliminary control electrode layer 128P, the inner side wall of the split trench 120T, and the upper surface of the support insulator layer 134, a second preliminary erase insulating layer covering the first preliminary erase insulating layer, a preliminary erase electrode layer covering the second preliminary erase insulating layer and filling the split trench 120T, and then removing portions of each of the preliminary erase electrode layer, the second preliminary erase insulating layer, and the first preliminary erase insulating layer such that the upper surface of the preliminary control electrode layer 128P is exposed.

In some embodiments, the erase gate electrode layer 144, the second erase gate insulating layer 142b, and the first erase gate insulating layer 142a may be formed by removing portions of each of the preliminary erase electrode layer, the second preliminary erase insulating layer, and the first preliminary erase insulating layer by performing a chemical mechanical polishing (CMP) process. The upper surface of the erase gate electrode layer 144 may be formed at the same level as the upper surface of the preliminary control electrode layer 128P.

The erase gate electrode layer 144 may be formed to have the third thickness T3 (e.g., about 400 Å to about 800 Å) greater than the first thickness T1 and the second thickness T2, respectively. An upper surface of the erase gate electrode layer 144 may be at the same level as an upper surface of the control gate electrode layer 128, and a lower surface of the erase gate electrode layer 144 may be at a lower level than a lower surface of the control gate electrode layer 128. In some embodiments, the lower surface of the erase gate electrode layer 144 may be at a lower level than an upper surface of the floating gate electrode layer 124 and may be at a higher level than a lower surface of the floating gate electrode layer 124.

Referring to FIG. 4E, a preliminary capping layer 150P may be formed to cover the upper surface of the preliminary control electrode layer 128P and the upper surface of the erase gate structure 140. In some embodiments, the preliminary capping layer 150P may include silicon nitride. The preliminary capping layer 150P may have the fourth thickness T4 (e.g., about 200 Å to about 400 Å) less than the first thickness T1 and the second thickness T2, respectively.

Referring to FIGS. 4E and 4F, the gate capping layer 150, the control gate electrode layer 128, the control gate insulating layer 126, and the floating gate electrode layer 124 may be formed by selectively removing portions of each of the preliminary capping layer 150P, the preliminary control electrode layer 128P, the preliminary control insulating layer 126P, and the preliminary floating electrode layer 124P. The control gate electrode layer 128, the control gate insulating layer 126, and the floating gate electrode layer 124 may be formed to be disposed on both sides of the erase gate structure 140.

FIG. 4F shows that the preliminary floating insulating layer 122P is not removed to cover the upper surface of the substrate 110, but the scope of the inventive concept is not limited thereto. For example, during the process(es) used of remove portions of each of the preliminary capping layer 150P, the preliminary control electrode layer 128P, the preliminary control insulating layer 126P, and the preliminary floating electrode layer 124P, a portion of the preliminary floating insulating layer 122P may be removed to expose a portion of the substrate 110.

Referring to FIG. 4G, the pair of gate spacers 160 may be formed to cover the outer side walls of the floating gate electrode layer 124, the control gate insulating layer 126, and the control gate electrode layer 128. Each of the pair of gate spacers 160 may have a stacked structure including the first gate spacer 162 and the second gate spacer 164 disposed on the first gate spacer 162.

For example, after a first preliminary spacer conformally covering the result of FIG. 4F and a second preliminary spacer conformally covering the first preliminary spacer are formed, the gate spacer 160 (e.g., the stacked structure of the first gate spacer 162 and the second gate spacer 164) may be formed by removing portions of the first preliminary spacer and the second preliminary spacer. The first preliminary spacer may be formed to include silicon oxide, and the second preliminary spacer may be formed to include silicon nitride.

Accordingly, the first gate spacer 162 may be formed to the fifth thickness T5 (e.g., about 10 Å to about 100 Å), and the second gate spacer 164 may be formed to the sixth thickness T6 (e.g., about 100 Å to about 150 Å) greater than the fifth thickness T5.

Thereafter, impurities may be introduced into a portion of the substrate 110 that does not overlap the gate capping layer 150 and the gate spacer 160 to form the first impurity region 116. The first impurity region 116 may be formed by injecting impurities having the same conductivity as the active region 112 in order to have an impurity concentration greater than that of the active region 112.

In some embodiments, in the process of forming the gate spacer 160, a portion of the preliminary floating insulating layer 122P shown in FIG. 4F may be removed to form the floating gate insulating layer 122.

The floating gate insulating layer 122, the floating gate electrode layer 124, the control gate insulating layer 126, and the control gate insulating layer 128, which are sequentially stacked on the substrate 110, may be respectively disposed on both sides of the erase gate structure 140 to constitute the pair of split gate structures 120.

The floating gate insulating layer 122, the floating gate electrode layer 124, the control gate insulating layer 126, and the control gate insulating layer 128, which are disposed on both sides of the erase gate structure 140 and sequentially stacked on the substrate 110, may constitute the pair of split gate structures 120.

Referring to FIG. 4H, a first cover insulating layer 172 may be formed on the resulting structure of FIG. 4G. The first cover insulating layer 172 may be formed to include silicon oxide. The first cover insulating layer 172 may be formed to cover the entire result of FIG. 4G.

Referring to FIG. 4H and FIG. 4I, a portion of the first cover insulating layer 172 may be removed to form a first residual insulating layer 172a. In some embodiments, the first residual insulating layer 172a may cover the gate spacer 160, but may not cover the gate capping layer 150 and at least a portion of the substrate 110 including the first impurity region 116.

The first residual insulating layer 172a may cover the second gate spacer 164 not to be exposed to the outside. After forming the first residual insulating layer 172a, in a low voltage logic region LVR and/or a high voltage logic region HVR of FIG. 10, a cleaning process for removing components made of a material having the same or similar etch properties as the second gate spacer 164 may be performed. The second gate spacer 164 may be covered by the first residual insulating layer 172a, so that the first residual insulating layer 172a may remain as it is without removal.

Referring to FIGS. 4I and 4J, the first residual insulating layer 172a may be removed. In some embodiments, during the process(es) used to remove the first residual insulating layer 172a, a portion of the floating gate insulating layer 122 arranged below the gate spacer 160 may be removed. In some other embodiments, if there is a residual portion of the preliminary floating insulating layer 122P covering the substrate 110 shown in FIG. 4F, which does not overlap the floating gate electrode layer 124 and the gate spacer 160 to a step shown in FIG. 4I, the residual portion may be removed using the process(es) that remove the first residual insulating layer 172a.

Referring to FIG. 4K, a second cover insulating layer 174 may be formed on the resulting structure of FIG. 4J. The second cover insulating layer 174 may be formed to include silicon oxide. The second cover insulating layer 174 may be formed to cover the entire result of FIG. 4J. In some embodiments, the second cover insulating layer 174 may be formed to conformally cover a surface exposed in the result of FIG. 4J.

Referring to FIG. 4L, a mask layer 175 for covering the entire result of FIG. 4K may be formed. The mask layer 175 may be formed to be sufficiently thick, so as to have a higher upper surface than an uppermost surface of the second cover insulating layer 174. The mask layer 175 may be formed so as not to cover at least a portion of the low voltage logic region LVR and the high voltage logic region HVR of FIG. 10. The mask layer 175 may include, for example, photoresist.

Referring to FIGS. 4L and 4M, the mask layer 175 may be removed, and then a strain layer 176 may be formed. The strain layer 176 may include, for example, silicon nitride. In a subsequent process, the strain layer 176 may remain in at least a portion of the low voltage logic region LVR and the high voltage logic region HVR of FIG. 10 in the portion wherein a PMOS transistor is formed and may serve as an applied strain to the PMOS transistor.

Referring to FIGS. 4M and 4N, a portion of the strain layer 176 may be removed. As described above, all of the strain layer 176 may be removed in the memory cell region MCR (see, e.g., FIG. 10), but only a portion of the strain layer 176 may be removed in the at least a portion of the low voltage logic region LVR and the high voltage logic region HVR so that the remainder of the strain layer 176 remains.

Referring to FIGS. 4N and 4O, a portion of the second cover insulating layer 174 may be removed. All of the second cover insulating layer 174 may be removed in the memory cell region MCR and the low voltage logic region LVR of FIG. 10, but only a portion of the second cover insulating layer 174 may be removed in at least a portion of the high voltage logic region HVR so that the remainder of the second cover insulating layer 174 remains. The remainder of the second cover insulating layer 174 remaining in the at least a portion of the high voltage logic region HVR of FIG. 10 may be removed in the subsequent process.

The second gate spacer 164 may cover most of the first gate spacer 162, so that the damage of the first gate spacer 162 in the process of removing a portion of the second cover insulating layer 174 may be minimized.

Referring to FIG. 4P, a third cover insulating layer 178 may be formed on the resulting structure of FIG. 4O. The third cover insulating layer 178 may be formed to include silicon oxide.

Referring to FIGS. 4P and 4Q, a portion of the third cover insulating layer 178 may be removed. All of the third cover insulating layer 178 may be removed in the memory cell region MCR and the low voltage logic region LVR of FIG. 10, but only a portion of the third cover insulating layer 178 may be removed in at least a portion of the high voltage logic region HVR so that the remainder of the third cover insulating layer 178 remains. The remainder of the third cover insulating layer 178 remaining in the at least a portion of the high voltage logic region HVR of FIG. 10 may be a second gate insulating layer 242 of FIG. 10.

Referring to FIG. 4R, the selection gate structure 180 in which the selection gate insulating layer 182 and the selection gate electrode layer 184 covering the selection gate insulating layer 182 are stacked may be formed on the result of FIG. 4Q. The selection gate insulating layer 182 may conformally cover the portion of the upper surface of the substrate 110, that is, the portion of the upper surface of the first impurity region 116, the side surface and the upper surface of the gate spacer 160, and the portion of the upper surface of the gate capping layer 150. The selection gate electrode layer 184 may be formed to overlap the selection gate insulating layer 182. The upper surface of the selection gate structure 180, that is, the upper surface of the selection gate electrode layer 184, may be formed to be at the higher level than the upper surface of the gate capping layer 150. On the upper surface of the gate capping layer 150, the selection gate electrode layer 184 may have the seventh thickness T7 (about 400 Å to about 700 Å). In some embodiments, the seventh thickness T7 may be greater than the first thickness T1 and the second thickness T2, respectively.

The selection gate insulating layer 182 and the selection gate electrode layer 184 may be formed by forming a preliminary selection insulating layer that conformally covers a surface exposed in the result of the FIG. 4Q and a preliminary selection electrode layer that covers the preliminary selection insulating layer and has a upper surface thereof located at the higher level than the upper surface of the gate capping layer 150, and then removing a portion of the preliminary selection insulating layer and the preliminary selection electrode layer.

Figure 10:
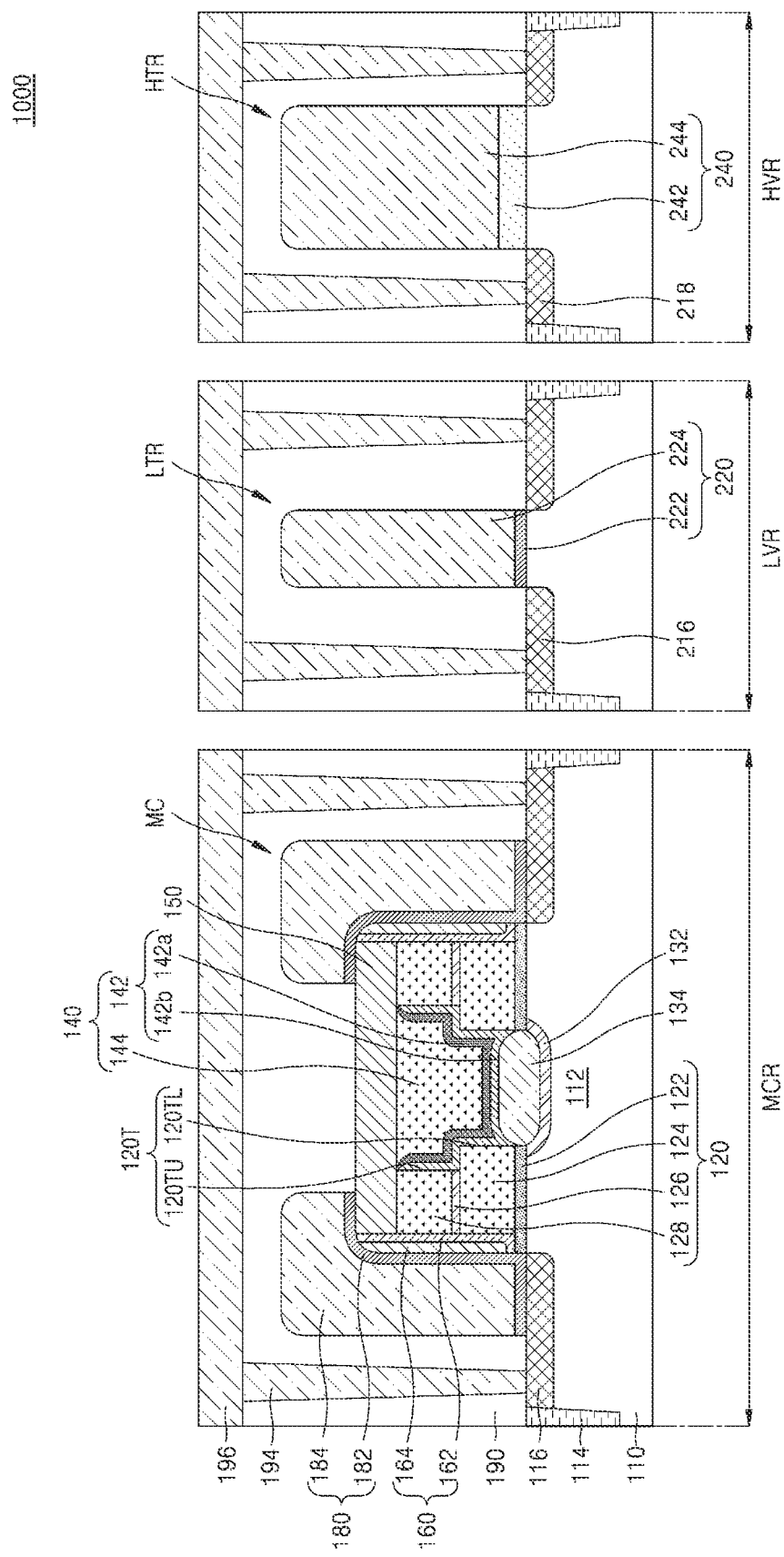
FIG. 10 is a cross-sectional view illustrating an IC device including a memory cell device and a logic device according to embodiments of the inventive concept.

A portion of the portion formed in the low voltage logic region LVR among the preliminary selection insulating layer may remain to be a first gate insulating layer 222 of FIG. 10. A portion of the portion formed in the low voltage logic region LVR among the preliminary selection electrode layer may remain to be a first gate electrode layer 224 of FIG. 10. In some embodiments, a portion of the portion formed in the high voltage logic region HVR among the preliminary selection electrode layer may remain to be a second gate electrode layer 244 of FIG. 10.

The pair of selection gate structures 180 may be formed to be disposed on the outside of the pair of split gate structures 120. The selection gate structure 180 may be formed to cover a portion of the substrate 110 on the outer side of each of the pair of split gate structures 120 and the gate spacer 160 and extend on a portion of the upper surface of the gate capping layer 150.

Thereafter, as shown in FIG. 3, the interlayer insulating film 190, the bit line contact 194 penetrating the interlayer insulating film 190, and the bit line 196 that is electrically connected to the first impurity region 116 via the bit line contact 194 and is disposed on the interlayer insulating film 190, may be formed to form the IC device 100.

According to methods of manufacturing the IC device 100 including the memory cell device MC according to embodiments of the inventive concept, certain substantially identical processes may be performed on the memory cell region MCR in which the memory cell device MC is arranged, the low voltage logic region LVR, and/or the high voltage logic region HVR of FIG. 10, such that the overall manufacturing process may be simplified and the manufacturing costs may be reduced. In addition, by the gate spacer 160, damage to the memory cell device MC may be prevented, thereby improving reliability of the IC device 100 including the memory cell device MC.

Figure 5:
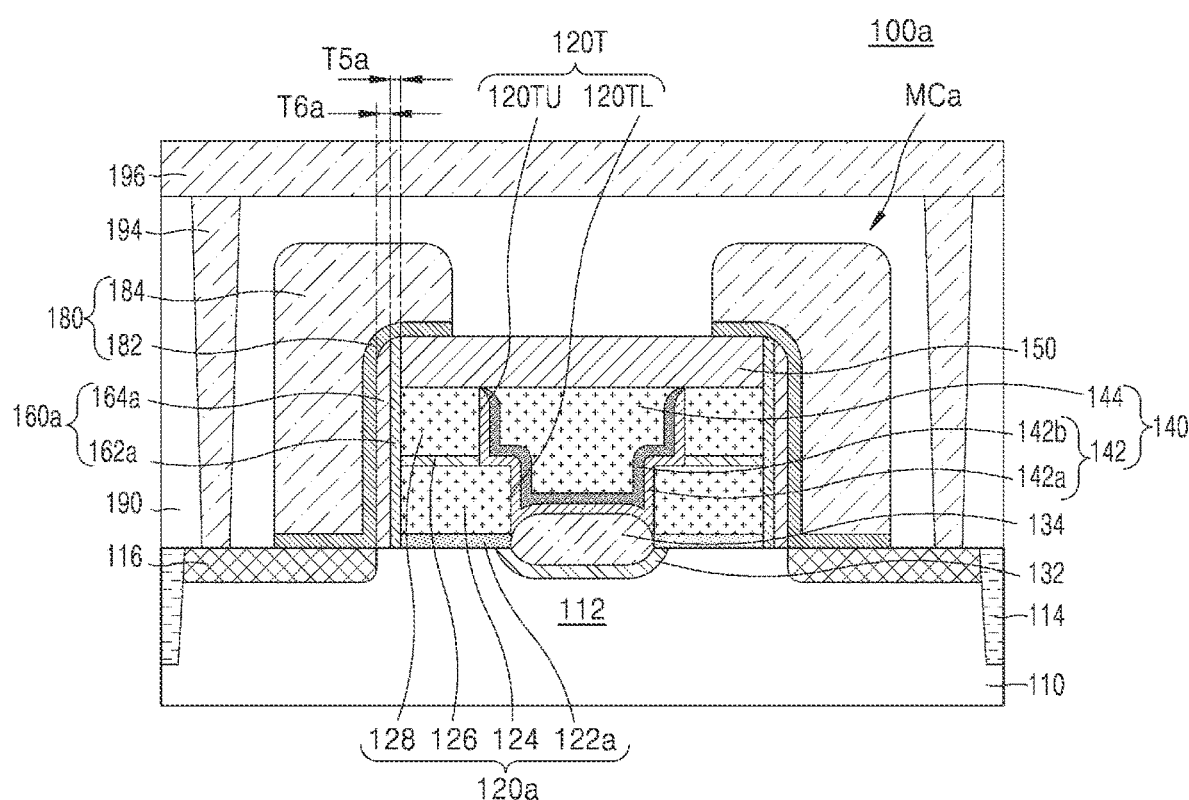
FIG. 5 is a cross-sectional view illustrating an IC device including a memory device according to embodiments of the inventive concept.

FIG. 5 is a cross-sectional view illustrating an IC device 100a including a memory device according to embodiments of the inventive concept. Only material differences between the embodiment of FIG. 5 and the embodiments previously described in relation to FIG. 3 and FIGS. 4A to 4R will be highlighted.

Referring to FIG. 5, an IC device 100a may include a memory cell device MCa. The memory cell device MCa may be formed in a memory cell region MCR of FIG. 10. The IC device 100a may include the substrate 110, and a split gate structure 120a, the erase gate structure 140, and the selection gate structure 180 formed on the substrate 110. For example, one memory cell device MCa may include a pair of split gate structures 120a, the erase gate structure 140, and the pair of selection gate structures 180. The memory cell device MCa may have a split gate shape in which the split gate structures 120a and the selection gate structures 180 are respectively disposed on both sides of the erase gate structure 140. The split gate structure 120a may include a floating gate insulating layer 122a, the floating gate electrode layer 124, the control gate insulating layer 126, and the control gate electrode layer 128, which are sequentially stacked on the substrate 110.

The outer side walls of the pair of split gate structures 120a based on the split trench 120T, that is, the outer side walls of the floating gate insulating layer 122a, the floating gate electrode layer 124, the control gate insulating layer 126, and the control gate electrode layer 128 may be vertically aligned. In the pair of split gate structures 120a, based on the split trench 120T, inner side walls of the floating gate insulating layer 122a and the floating gate electrode layer 124 may be vertically aligned, and inner side walls of the control gate insulating layer 126 and the control gate electrode layer 128 may be vertically aligned. The floating gate insulating layer 122a may only be between the substrate 110 and the floating gate electrode layer 124, but may not be between the substrate 110 and the gate spacer 160a.

A pair of gate spacers 160a may cover outer side walls of the pair of split gate structures 120a and both side walls of the gate capping layer 150. Specifically, one of the pair of gate spacers 160a may cover one outer side wall of the pair of split gate structures 120a, that is, the outer side walls of each of the floating gate insulating layer 122a, the floating gate electrode layer 124, the control gate insulating layer 126, and the control gate electrode layer 128, and one of the both side walls of the gate capping layer 150, and the other of the pair of gate spacers 160a may cover the other outer side wall of the pair of split gate structures 120a and the other of the both side walls of the gate capping layer 150. The gate spacer 160a may cover the side walls of each of the floating gate insulating layer 122a, the floating gate electrode layer 124, the control gate insulating layer 126, the control gate electrode layer 128, and the gate capping layer 150.

Each of the pair of gate spacers 160a may have a stacked structure of a first gate spacer 162a and a second gate spacer 164a disposed on the first gate spacer 162a. In some embodiments, the first gate spacer 162a may include silicon oxide, and the second gate spacer 164a may include silicon nitride.

The first gate spacer 162a may have an I shape (extending in substantially the vertical direction) with substantially the same thickness contacting the side walls of each of the floating gate insulating layer 122a, the floating gate electrode layer 124, the control gate insulating layer 126, the control gate electrode layer 128, and the gate capping layer 150, and the second gate spacer 164a may have an I shape (extending in substantially the vertical direction) with substantially the same thickness.

The first gate spacer 162a may have a fifth thickness T5a (e.g., about 10 Å to about 100 Å), and the second gate spacer 164a may have a sixth thickness T6a (e.g., about 100 Å to about 150 Å) greater than the fifth thickness T5a, wherein each of the fifth thickness T5a and the sixth thickness T6a is an overlaying material(s) thickness.

The lowermost end of the gate spacer 160a may contact the active region 112 of the substrate 110. In some embodiments, the lowermost end of the gate spacer 160a may be at the same level as a lower surface of the floating gate insulating layer 122a. The lowermost end of the first gate spacer 162a and the lowermost end of the second gate spacer 164a may be at the same level. The lowermost end of the first gate spacer 162a and the lowermost end of the second gate spacer 164a may contact the active region 112 of the substrate 110. For example, each of the lowermost end of the first gate spacer 162a and the lowermost end of the second gate spacer 164a may be at the same level as the lower surface of the floating gate insulating layer 122a. The lowermost end of the gate spacer 160a may be at the same level as the upper surface of the gate capping layer 150.

The pair of selection gate structures 180 may be disposed on the outside of the pair of split gate structures 120a. The selection gate structure 180 may cover a portion of the substrate 110 on the outer side of each of the pair of split gate structures 120a and the gate spacer 160a and extend on a portion of the upper surface of the gate capping layer 150. The selection gate structure 180 may entirely, vertically overlap the gate spacer 160a. The selection gate structure 180 may include the stacked structure of the selection gate insulating layer 182 and the selection gate electrode layer 184 covering the selection gate insulating layer 182. The selection gate insulating layer 182 may conformally cover a portion of the upper surface of the substrate 110, that is, the portion of the upper surface of the first impurity region 116, a side surface and the upper surface of the gate spacer 160a, and a portion of the upper surface of the gate capping layer 150.

Figure 6A:
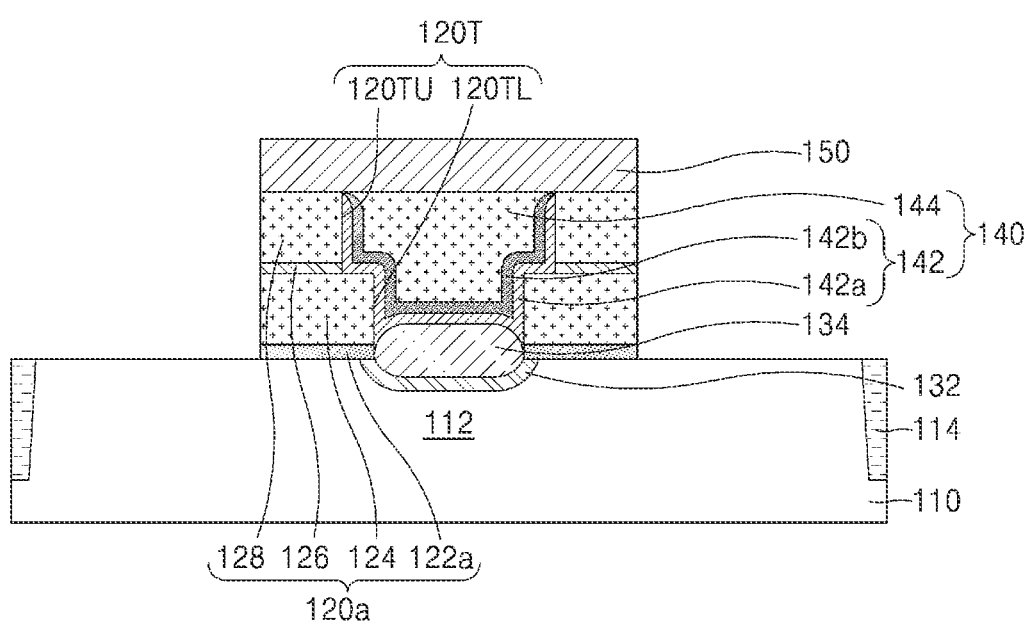
FIGS. 6A, 6B and 6C are related cross-sectional views illustrating a method of manufacturing an IC device including a memory cell device according to embodiments of the inventive concept.
Figure 6B:
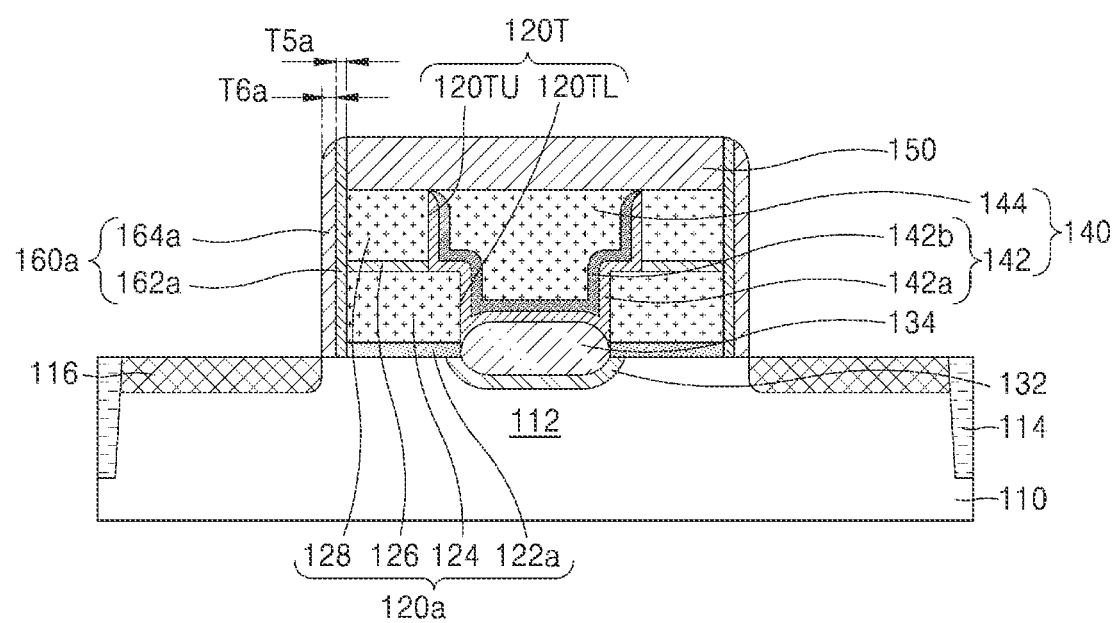
Figure 6C:
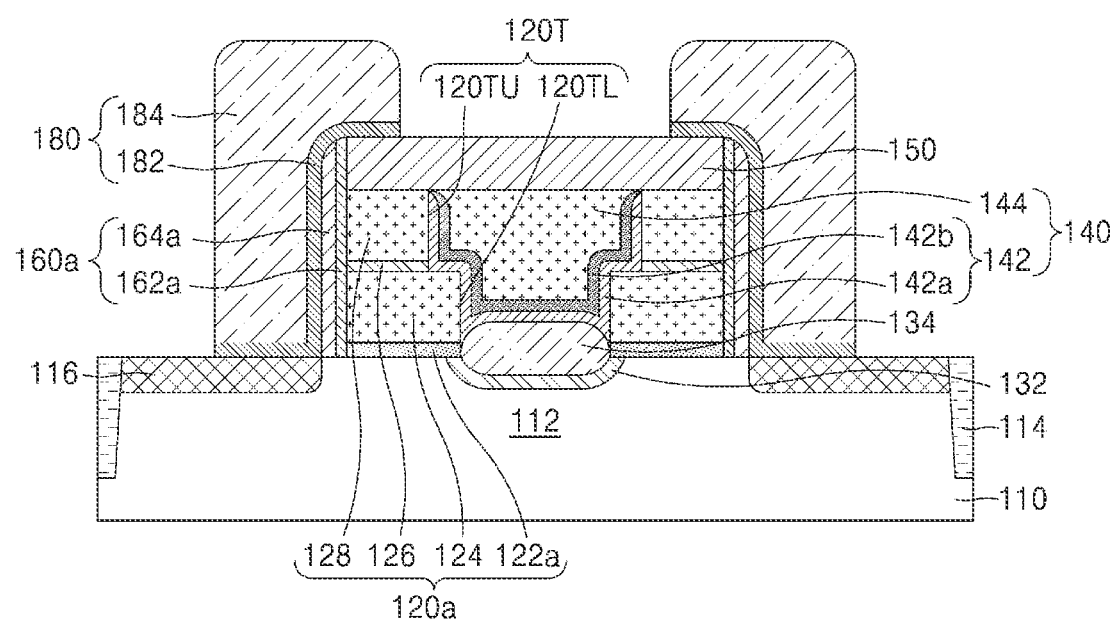

FIGS. 6A, 6B and 6C are related cross-sectional views illustrating a method of manufacturing the IC device 100ca of FIG. 5 including a memory cell device according to embodiments of the inventive concept.

Referring to FIGS. 5 and 6A, and further comparing FIG. 4E with FIG. 6A, the gate capping layer 150, the control gate electrode layer 128, the control gate insulating layer 126, the floating gate electrode layer 124, the floating gate insulating layer 122a may be formed by removing portions of each of the preliminary capping layer 150P, the preliminary control electrode layer 128P, the preliminary control insulating layer 126P, the preliminary floating electrode layer 124P, and the preliminary floating insulating layer 122P. The control gate electrode layer 128, the control gate insulating layer 126, and the floating gate electrode layer 124, and the floating gate insulating layer 122a may be formed to be disposed on both sides of the erase gate structure 140. The floating gate insulating layer 122a, the floating gate electrode layer 124, the control gate insulating layer 126, and the control gate insulating layer 128, which are sequentially stacked on the substrate 110, may constitute the pair of split gate structures 120a.

Referring to FIGS. 5 and 6B, the pair of gate spacers 160a that cover the outer side walls of the pair of split gate structures 120a disposed on both sides of the erase gate structure 140, that is, the outer side walls of each of the floating gate insulating layer 122a, the floating gate electrode layer 124, the control gate insulating layer 126, and the control gate electrode layer 128, and cover both side walls of the gate capping layer 150, may be formed. Each of the pair of gate spacers 160a may have a stacked structure of the first gate spacer 162*a* and the second gate spacer 164*a* disposed on the first gate spacer 162*a*.

For example, after forming a first preliminary spacer that conformally covers the result of FIG. 6A, a portion of the first preliminary spacer may be removed to form the first gate spacer 162*a*, and after forming a second preliminary spacer that conformally covers the result formed with the first gate spacer 162*a*, a portion of the second preliminary spacer may be removed to form the second gate spacer 164*a*.

The first gate spacer 162*a* may be formed to have the fifth thickness T5*a*, and the second gate spacer 164*a* may be formed to have the sixth thickness T6*a*.

Thereafter, impurities may be introduced into a portion of the substrate 110 that does not overlap the gate capping layer 150 and the gate spacer 160*a* to form the first impurity region 116.

Although not shown in FIGS. 6A and 6B, after the gate spacer 160*a* and the first impurity region 116 are formed, substantially the same manufacturing process(es) as those described in relation to FIGS. 4H to 4Q may be performed.

Referring to FIG. 6C, by performing substantially the same manufacturing process(es) as those described in relation to FIG. 4R on the resulting structure of FIG. 6B, the selection gate structure 180 may be formed in which the selection gate insulating layer 182 and the selection gate electrode layer 184 covering the selection gate insulating layer 182 are stacked. The selection gate insulating layer 182 may conformally cover the portion of the upper surface of the substrate 110, that is, the portion of the upper surface of the first impurity region 116, the side surface and the upper surface of the gate spacer 160*a*, and the portion of the upper surface of the gate capping layer 150. The selection gate electrode layer 184 may be formed to overlap the selection gate insulating layer 182.

Thereafter, as shown in FIG. 5, the interlayer insulating film 190, the bit line contact 194 penetrating the interlayer insulating film 190, and the bit line 196 that is electrically connected to the first impurity region 116 via the bit line contact 194 and is disposed on the interlayer insulating film 190, may be formed to form the IC device 100*a*.

Figure 7:
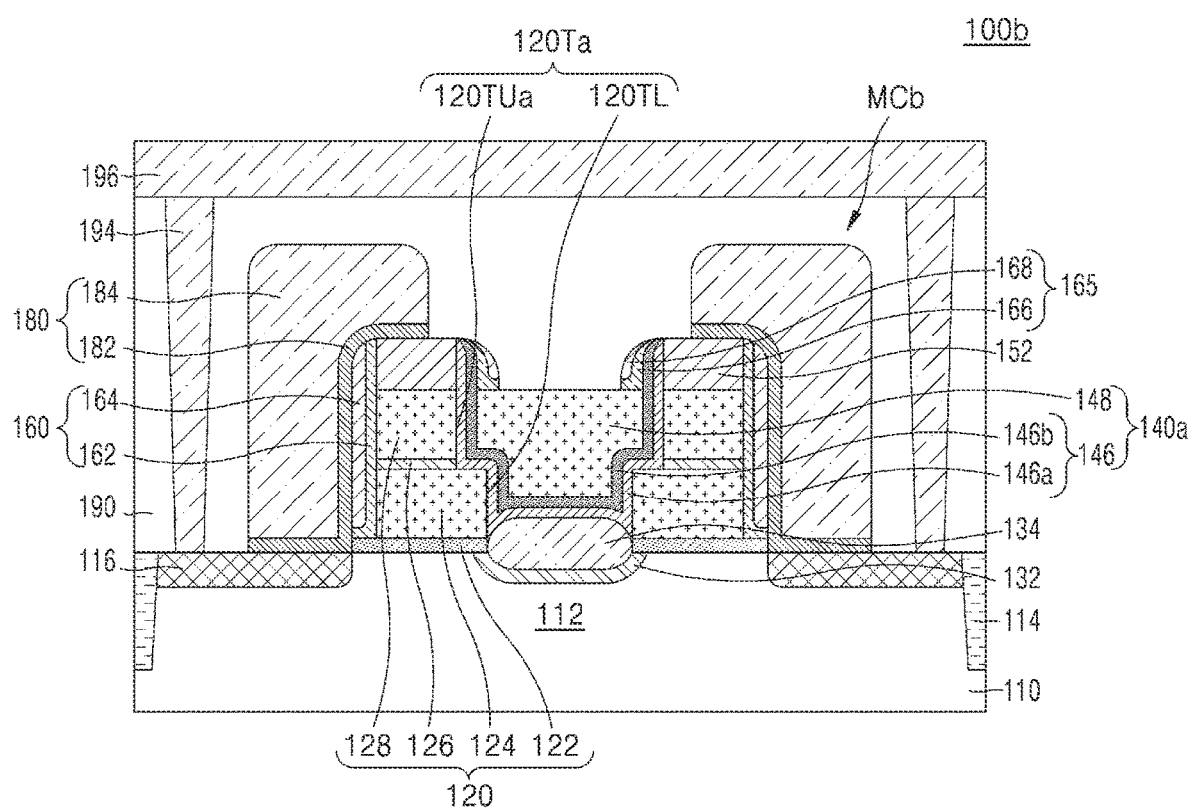
FIG. 7 is a cross-sectional view illustrating an IC device including a memory device according to embodiments of the inventive concept.

FIG. 7 is a cross-sectional view illustrating an IC device 100*b* including a memory device according to embodiments of the inventive concept. Only material differences between the embodiment of FIG. 7 and the embodiments previously described in relation to FIGS. 3 and 5 will be highlighted.

Referring to FIG. 7, the IC device 100*b* may include a memory cell device MCb formed in the memory cell region MCR of FIG. 10. Here, the IC device 100*b* may include a substrate 110, and a split gate structure 120, an erase gate structure 140, and a selection gate structure 180 formed on the substrate 110. For example, one memory cell device MCb may include a pair of split gate structures 120, the erase gate structure 140, and a pair of selection gate structures 180. The memory cell device MCb may have a split gate shape in which the split gate structures 120 and the selection gate structures 180 are respectively disposed on both sides of the erase gate structure 140.

A pair of gate capping layers 152 may cover the pair of split gate structures 120. Each of the pair of gate capping layers 152 may cover the upper surface of the floating gate electrode layer 124 of each of the pair of split gate structures 120, and may be spaced apart from each other so as not to cover the upper surface of an erase gate electrode layer 148. Each of the pair of gate capping layers 152 may cover the entire upper surface of the control gate electrode layer 128 of each of the pair of split gate structures 120. An outer side wall and an inner side wall of the gate capping layer 152 may be respectively and vertically aligned with the outer side wall and the inner side wall of the control gate insulating layer 126 and the control gate electrode layer 128 of the split gate structure 120. In some embodiments, the gate capping layer 152 may include silicon nitride.

The pair of split gate structures 120 may be spaced apart from each other with a split trench 120Ta therebetween. The split trench 120Ta may include the lower split trench 120TL and an upper split trench 120TUa. The lower split trench 120TL may be disposed in a space between the pair of stacked structures of the floating gate insulating layer 122 and the floating gate electrode layer 124, and the upper split trench 120TUa may be disposed in a space between a pair of stacked structures of the control gate insulating layer 126, the control gate electrode layer 128, and the gate capping layer 152. The horizontal width of the lower split trench 120TL may be less than that of the upper split trench 120TUa.

The outer side walls of the pair of gate capping layers 152 based on the split trench 120Ta and the outer side walls of each of the floating gate electrode layer 124, the control gate insulating layer 126, and the control gate electrode layer 128 may be vertically aligned. Based on the split trench 120Ta, the inner side walls of the floating gate insulating layer 122 and the floating gate electrode layer 124 among the pair of split gate structures 120*a* may be vertically aligned, and the inner side walls of the control gate insulating layer 126 and the control gate electrode layer 128, and an inner side walls of the capping layer 152 may be vertically aligned.

A second impurity region 132 may be formed at an upper part of the active region 112 of the substrate 110 between the pair of split gate structures 120. For example, the second impurity region 132 may provide the source region of the memory cell device MCb. A support insulator layer 134 may be disposed on the second impurity region 132.

An erase gate structure 140*a* may be disposed on the support insulator layer 134. The erase gate structure 140*a* may fill at least a portion of the split trench 120Ta. The erase gate structure 140*a* may include an erase gate insulating layer 146 that covers an inner surface of the split trench 120Ta, that is, a bottom surface and a side surface of the split trench 120Ta, and the erase gate electrode layer 148 that is disposed on the erase gate insulating layer 146 and fills at least a portion of the split trench 120Ta.

The erase gate insulating layer 146 may cover the inner side walls of the pair of split gate structures 120 which are exposed in the split trench 120Ta, the inner side walls of the pair of the gate capping layer 152, and the upper surface of the support insulator layer 134. In some embodiments, the erase gate insulating layer 146 may be a stacked structure of a first erase gate insulating layer 146*a* and a second erase gate insulating layer 146*b* covering the first erase gate insulating layer 146*a*.

The first erase gate insulating layer 146*a* may include at least one selected from silicon oxide or a material having a higher permittivity than that of the silicon oxide, for example, a high-k dielectric material and a ferroelectric material. In some embodiments, the first erase gate insulating layer 146*a* may have a thickness of several tens to hundreds Å. The second erase gate insulating layer 146*b* may include silicon oxide. The second erase gate insulating layer 146*b* may have a thickness of several tens Å.

The erase gate electrode layer 148 may cover the second erase gate insulating layer 146*b*. The erase gate electrode layer 148 may include, for example, polysilicon, metal, conductive metal nitride, conductive metal silicide, or combinations thereof.

An upper surface of the erase gate electrode layer 148 may be at a lower level than an uppermost end of the control gate electrode layer 146, and a lower surface of the erase gate electrode layer 148 may be at a lower level than the lower surface of the control gate electrode layer 128. In some embodiments, the lower surface of the erase gate electrode layer 148 may be at a lower level than the upper surface of the floating gate electrode layer 124 and may be at a higher level than the lower surface of the floating gate electrode layer 124. In some embodiments, the upper surface of the erase gate electrode layer 148 may be at the same level as the upper surface of the control gate electrode layer 128, but is not limited thereto. For example, the upper surface of the erase gate electrode layer 148 may be adjacent to a level in which the upper surface of the control gate electrode layer 128 is located, that is, it may be at a slightly lower or higher level than the upper surface of the control gate electrode layer 128.

The pair of gate spacers 160 may cover the outer side walls of each of the floating gate electrode layer 124, the control gate insulating layer 126, and the control gate electrode layers 128 among the pair of split gate structures 120, and the outer side walls of the pair of gate capping layer 152.

A pair of capping spacers 165 may cover the inner side walls of the pair of gate capping layers 152. Each of the pair of capping spacers 165 may have a stacked structure of a first capping spacer 166 and a second capping spacer 168 disposed on the first capping spacer 166. In some embodiments, the first capping spacer 166 and the second capping spacer 168 may be formed together with the same material as the first gate spacer 162 and the second gate spacer 164. In some embodiments, the first capping spacer 166 may include silicon oxide, and the second capping spacer 168 may include silicon nitride.

The first capping spacer 166 may have an L shape with substantially the same thickness while extending along the inner side wall of an upper portion of the second erase gate insulating layer 146*b* and a portion of the upper surface of the erase gate electrode layer 148, and the second capping spacer 168 may have an I shape (extending substantially in the vertical direction) with the same thickness while covering the first capping spacer 166. The thickness of the first capping spacer 166 and the second capping spacer 168 may be substantially the same as the thickness of the first gate spacer 162 and the second gate spacer 164, respectively.

A lowermost end of the capping spacer 165 may be at the same level as the upper surface of the gate capping layer 152, and the lowermost end of the capping spacer 165 may be at the same level as the upper surface of the erase gate electrode layer 148. For example, a lowermost end of the first capping spacer 166 may be at the same level as the upper surface of the erase gate electrode layer 148, and a lowermost end of the second capping spacer 168 may be at a higher level than the upper surface of the erase gate electrode layer 148.

The pair of selection gate structures 180 may be disposed on the outside of the pair of split gate structures 120. The selection gate structure 180 may cover a portion of the substrate 110 on the outer side of each of the pair of split gate structures 120 and the gate spacer 160 and extend on a portion of the upper surface of the gate capping layer 152.

The selection gate structure 180 may include the stacked structure of the selection gate insulating layer 182 and the selection gate electrode layer 184 covering the selection gate insulating layer 182. The selection gate insulating layer 182 may conformally cover the portion of the upper surface of the substrate 110, that is, the portion of the upper surface of the first impurity region 116, the side surface and the upper surface of the gate spacer 160, and a portion of the upper surface of the gate capping layer 152. The selection gate insulating layer 182 and the selection gate electrode layer 184 may overlap.

Alternately expressed, the integrated circuit (IC) device 100*b* of FIG. 7 may be understood as including a source region (e.g., 112 and 132) arranged in an upper portion of the substrate 110. The split gate structure 120 may include a first split gate (e.g., a right side portion of the split gate structure 120) disposed to one side of the source region and a second split gate (e.g., a left side portion of the split gate structure 120) disposed to another side of the source region. Here, each one of the first split gate includes a first floating gate electrode (e.g., 124) and a first control gate electrode (e.g., 128) on the first floating gate electrode, and the second split gate includes a second floating gate electrode (e.g., 124) and a second control gate electrode (e.g., 128) on the second floating gate electrode. An erase gate structure (e.g., 140*a*) may be disposed between the first split gate and the second split gate on the source region, may include an erase gate electrode (e.g., 148), and may be bounded by an erase gate insulating layer (e.g., 146) including a bottom surface, a first side surface, and a second side surface. A selection gate structure (e.g., 180) may include a first selection gate disposed on an outer side wall of the first split gate and a second selection gate disposed on an outer side wall of the second split gate. A first capping layer (e.g., 152) covering the first control gate electrode may be disposed on an outer side wall of the first side surface of the erase gate insulating layer, and a second capping layer (e.g., 152) covering the second control gate electrode may be disposed on an outer side wall of the second side surface of the erase gate insulating layer. A first capping element (e.g., 165) may be disposed on an inner side wall of the first side surface of the erase insulating layer to cover a first portion of the erase gate electrode, and a second capping element (e.g., 165) horizontally separated from the first caping element may be disposed on an inner side wall of the second surface of the erase insulating layer to cover a second portion of the erase gate electrode. A pair of gate spacers (e.g., 160) may include a first spacer (e.g., 162) disposed on an outer side wall of the first split gate and a second spacer (e.g., 164) disposed on an outer side wall of the second split gate. Here, each of the first spacer and the second spacer may include a first gate spacer (e.g., 166) and a second gate spacer (e.g., 168) disposed on the first gate spacer, wherein a lowermost end of the second gate spacer is at a lower level than an upper surface of the floating gate electrode layer.

Figure 8A:
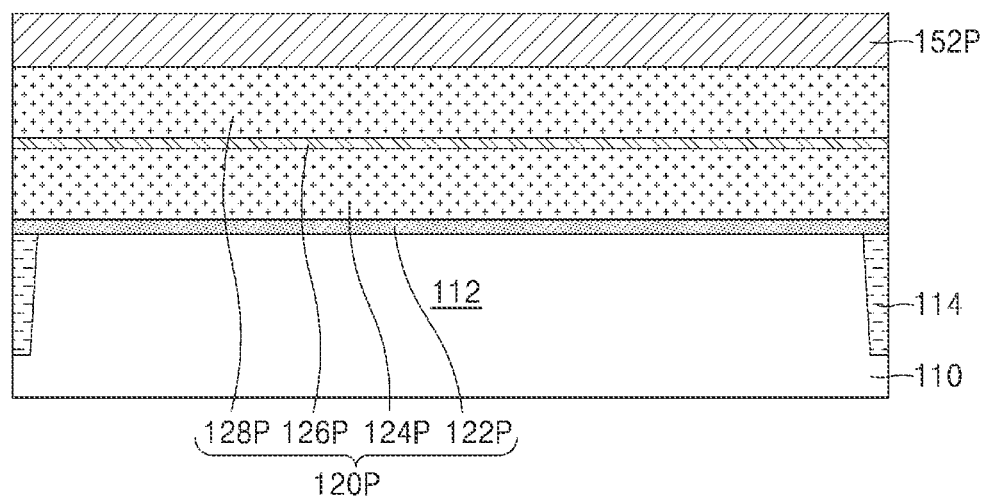
FIGS. 8A, 8B, 8C, 8D, 8E, 8F, 8G and 8H (hereafter collectively, "FIGS. 8A to 8H") are related cross-sectional views illustrating a method of manufacturing an IC device including a memory cell device according to embodiments of the inventive concept.

FIGS. 8A to 8H are related cross-sectional views illustrating a method of manufacturing the IC device 100*b* of FIG. 7 including a memory cell device according to embodiments of the inventive concept, wherein method steps beginning with the method step of FIG. 8A may be performed following the method step of FIG. 4A.

Referring to FIG. 8A, a preliminary capping layer 152P covering the preliminary split stacked structure 120P may be formed. The preliminary capping layer 152P may be the same material as the preliminary capping layer 150P shown in FIG. 4E, and may have substantially the same thickness as that of the preliminary capping layer 150P.

Figure 8B:
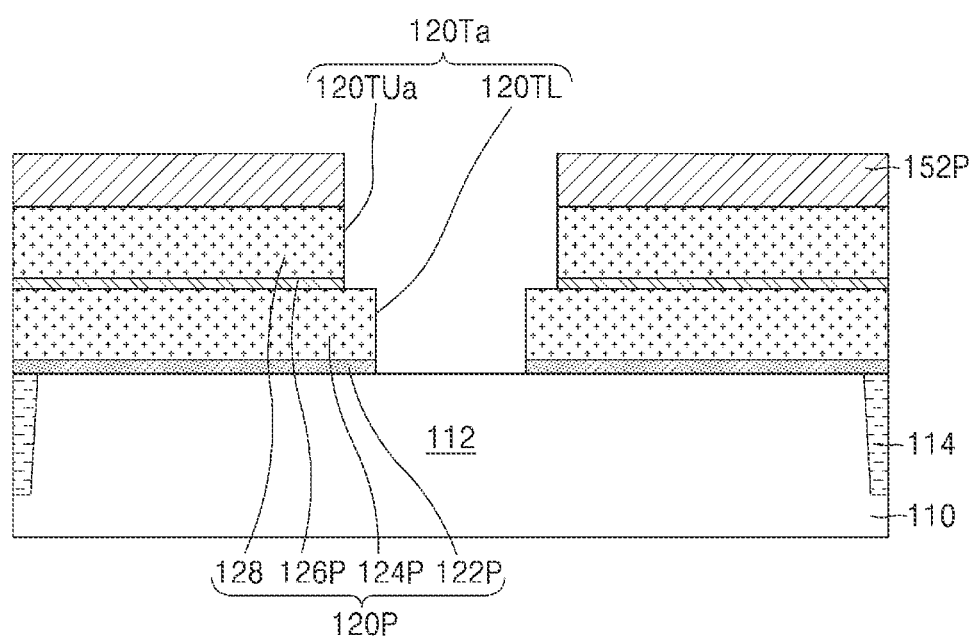

Referring to FIG. 8B, a split trench 120Ta for exposing the active region 112 of the substrate 110 may be formed by removing portions of each of the preliminary split stacked structure 120P and the preliminary capping layer 152P. The split trench 120Ta may include the lower split trench 120TL and the upper split trench 120TUa that communicate with each other. The horizontal width of the lower split trench 120TL may be less than that of the upper split trench 120TUa.

In some embodiments, the split trench 120Ta may be formed by first performing a first etching process for forming the upper split trench 120TUa by removing portions of the preliminary capping layer 152P, the preliminary control electrode layer 128P and the preliminary control insulating layer 126P, and then performing a second etching process for forming the lower split trench 120TL by removing portions of the preliminary floating electrode layer 124P and the preliminary floating insulating layer 122P through the upper split trench 120TUa.

Figure 8C:
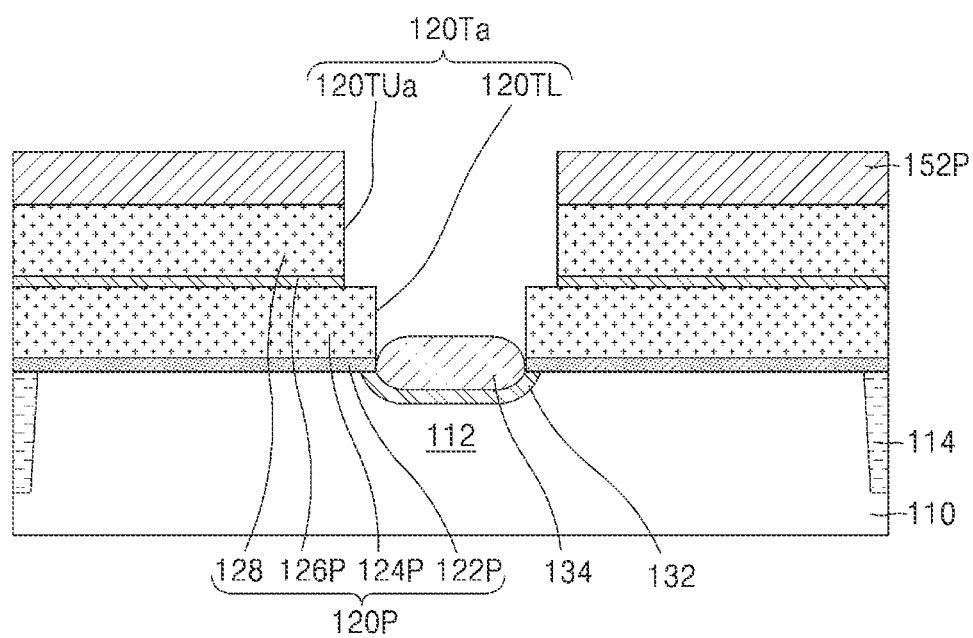

Referring to FIG. 8C, impurities may be introduced into the portion of the active region 112 of the substrate 110 that is exposed to the bottom surface of the split trench 120Ta to form the second impurity region 132, and the portion of the active region 112 of the substrate 110 may be oxidized to form the support insulator layer 134.

Figure 8D:
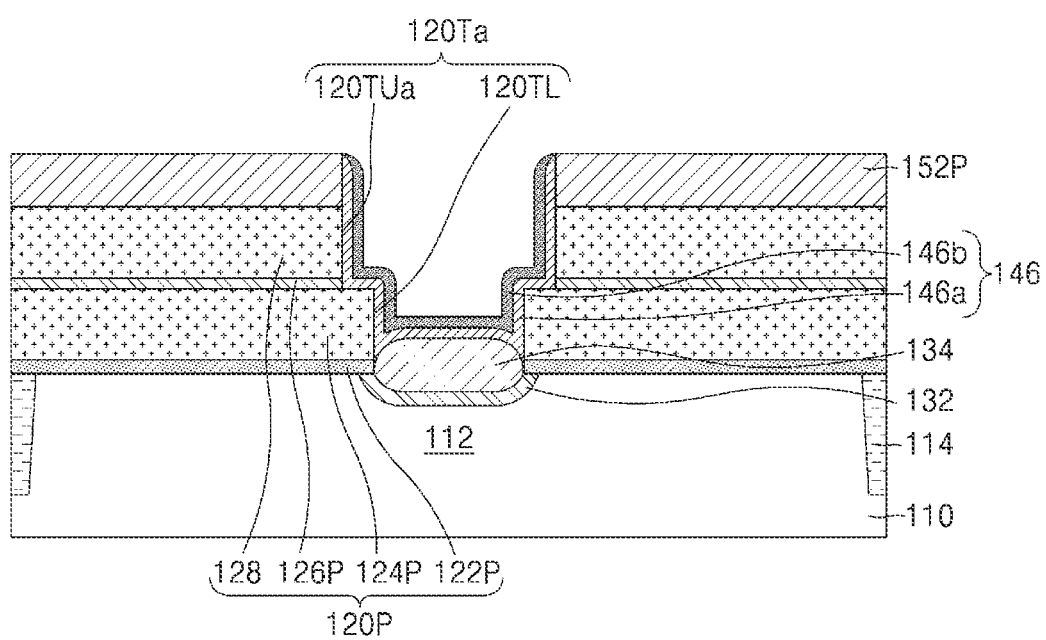

Referring to FIG. 8D, the erase gate insulating layer 146 covering the inner surface of the split trench 120Ta may be formed. The erase gate insulating layer 146 may be formed to cover inner side walls of each of the preliminary floating insulating layer 122P, the preliminary floating electrode layer 124P, the preliminary control insulating layer 126P, the preliminary control electrode layer 128P, and the preliminary capping layer 152P, and the upper surface of the support insulator layer 134, which are exposed in the split trench 120T.

In some embodiments, the erase gate insulating layer 146 may be the stacked structure including the first erase gate insulating layer 146a and the second erase gate insulating layer 146b covering the first erase gate insulating layer 146a. The first erase gate insulating layer 146a may be formed to conformally cover the inner side wall of the split trench 120Ta and the upper surface of the support insulator layer 134, and the second erase gate insulating layer 146b may be formed to conformally cover the first erase gate insulating layer 146a.

Figure 8E:
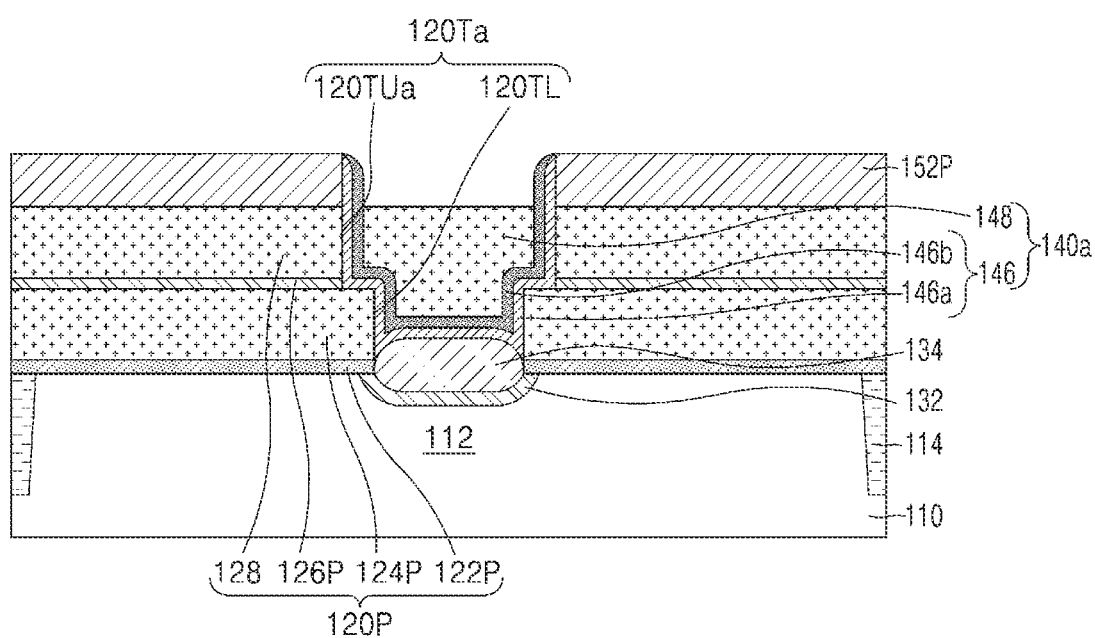

Referring to FIG. 8E, the erase gate electrode layer 148 may be formed to cover a portion of the erase gate insulating layer 146 and fill a portion of the split trench 120Ta. The erase gate insulating layer 146 and the erase gate electrode layer 148 may constitute the erase gate structure 140a. The erase gate electrode layer 148 may be formed to cover the portion of the second erase gate insulating layer 146b and fill a lower portion of the split trench 120Ta.

For example, a preliminary erase electrode layer filling the split trench 120Ta and covering an upper surface of the preliminary capping layer 152P may be sequentially formed and then a portion covering the upper surface of the preliminary capping layer 152P and a portion filling an upper portion of the split trench 120Ta among the preliminary erase electrode layer may be removed to form the erase gate electrode layer 148. In some embodiments, the erase gate electrode layer 148 may be formed by removing a portion of the preliminary erase electrode layer via an etching process. The upper surface of the erase gate electrode layer 148 may be formed at a lower level than the upper surface of the preliminary capping layer 152P.

Figure 8F:
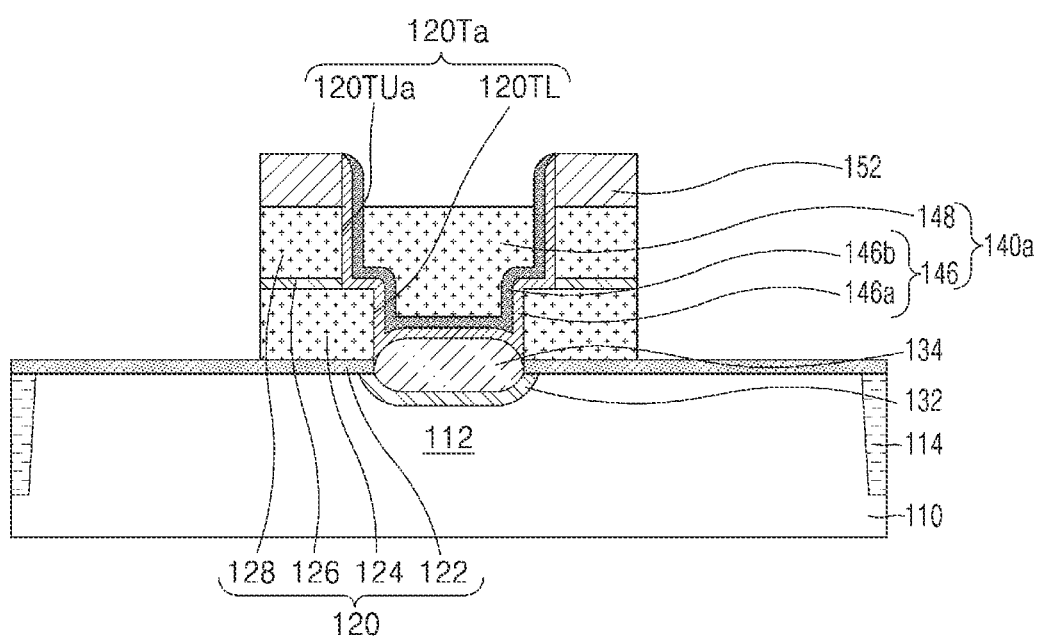

Referring to FIGS. 8E and 8F, the gate capping layer 152, the control gate electrode layer 128, the control gate insulating layer 126, and the floating gate electrode layer 124 may be formed by removing portions of each of the preliminary capping layer 152P, the preliminary control electrode layer 128P, the preliminary control insulating layer 126P, and the preliminary floating electrode layer 124P. The gate capping layer 152, the control gate electrode layer 128, the control gate insulating layer 126, and the floating gate electrode layer 124 may be formed to be disposed on both sides of the erase gate structure 140a.

Figure 8G:
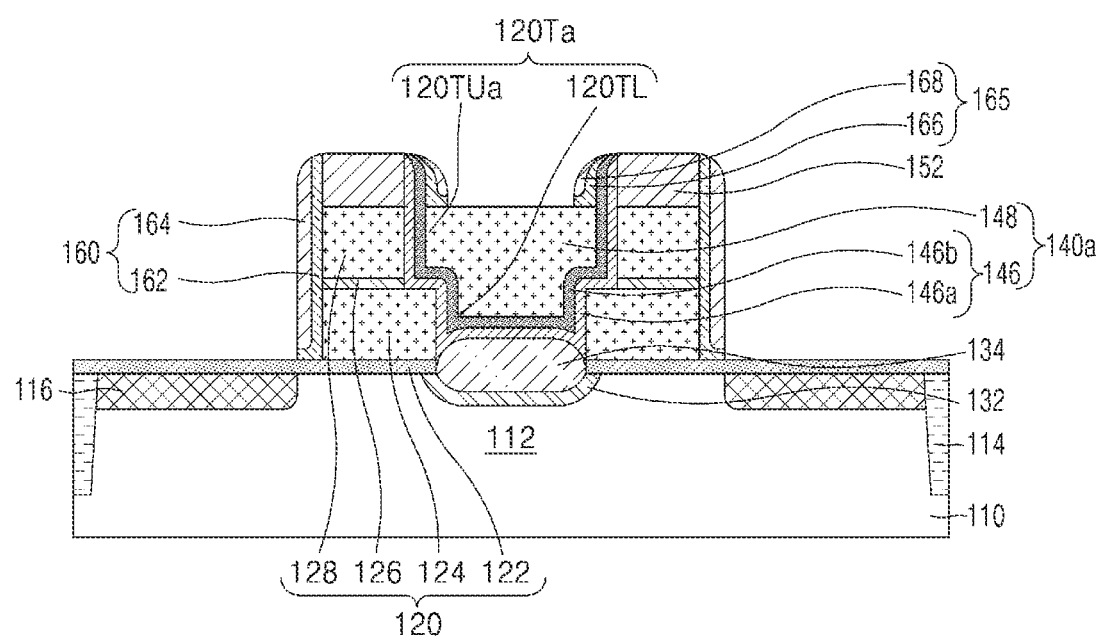

Referring to FIG. 8G, the pair of gate spacers 160 that covers the outer side walls of each of the floating gate electrode layer 124, the control gate insulating layer 126, the control gate electrode layer 128, and the gate capping layer 152 which are disposed on both sides of the erase gate structure 140a, and the pair of capping spacers 165 that covers the inner side wall of the gate capping layer 152, may be formed. Each of the pair of gate spacers 160 may be formed to have a stacked structure of the first gate spacer 162 and the second gate spacer 164 disposed on the first gate spacer 162, and each of the pair of capping spacers 165 may be formed to have a stacked structure of the first capping spacer 166 and the second capping spacer 168 disposed on the first capping spacer 166.

For example, after a first preliminary spacer conformally covering the result of FIG. 4F and a second preliminary spacer conformally covering the first preliminary spacer are formed, the gate spacer 160 having the stacked structure of the first gate spacer 162 and the second gate spacer 164 and the capping spacer 165 having the stacked structure of the first capping spacer 166 and the second capping spacer 168 may be formed by removing portions of the first preliminary spacer and the second preliminary spacer.

After forming the gate spacer 160 and the capping spacer 165, impurities may be introduced into a portion of the substrate 110 to form the first impurity region 116.

Although not shown, after the gate spacer 160, the capping spacer 165, and the first impurity region 116 have been formed, substantially the same manufacturing process(es) as those described in relation to FIGS. 4H to 4Q may be performed.

Figure 8H:
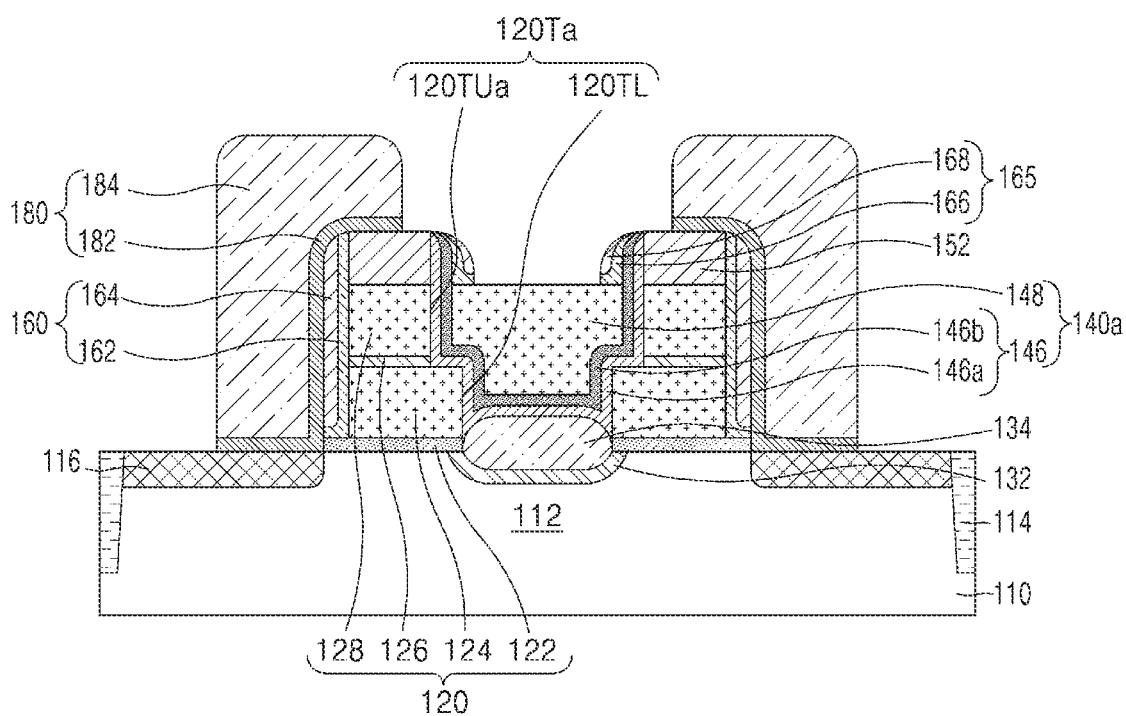

Referring to FIG. 8H, by perform substantially the same manufacturing process as those described in relation to FIG. 4R on the resulting structure of FIG. 8G, the selection gate structure 180 may be formed including the selection gate insulating layer 182 and the selection gate electrode layer 184 covering the selection gate insulating layer 182.

Thereafter, as shown in FIG. 7, the interlayer insulating film 190, the bit line contact 194 penetrating the interlayer insulating film 190, and the bit line 196 that is electrically connected to the first impurity region 116 via the bit line contact 194 and is disposed on the interlayer insulating film 190, may be formed to complete the IC device 100b of FIG. 7.

Figure 9:
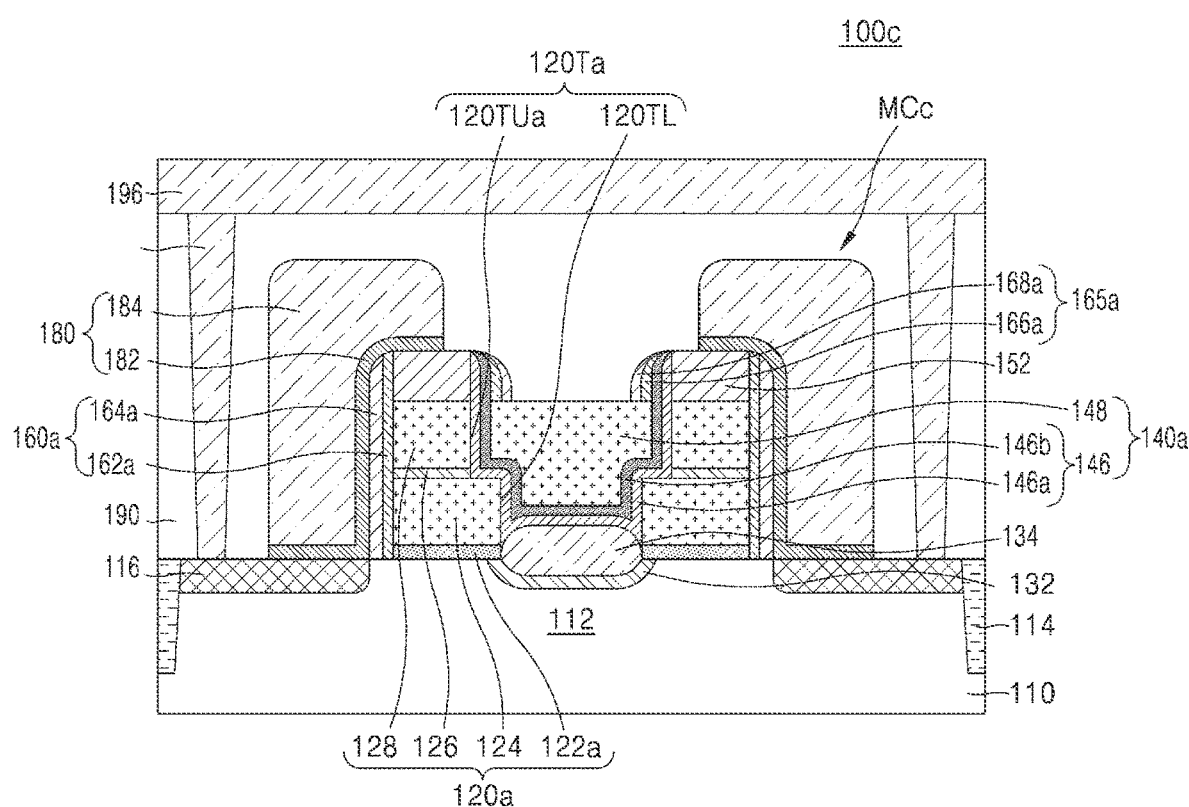
FIG. 9 is a cross-sectional view illustrating an IC device including a memory device according to embodiments of the inventive concept.

FIG. 9 is a cross-sectional view illustrating an IC device 100c including a memory device according to embodiments of the inventive concept. Only material differences between the embodiment of FIG. 9 and the embodiments previously described in relation to FIGS. 3, 5 and 7 will be highlighted.

Referring to FIG. 9, the IC device 100c may include a memory cell device MCc formed in the memory cell region MCR of FIG. 10. The IC device 100c may include the substrate 110, and a split gate structure 120a, the erase gate structure 140, and the selection gate structure 180 formed on the substrate 110. For example, one memory cell device MCc may include a pair of split gate structures 120a, the erase gate structure 140, and the pair of selection gate structures 180. The memory cell device MCc may have a split gate shape in which the split gate structures 120a and the selection gate structures 180 are respectively disposed on both sides of the erase gate structure 140.

A pair of gate capping layers 152 may cover the pair of split gate structures 120a. Each of the pair of gate capping layers 152 may cover the entire upper surface of the control gate electrode layer 128 of each of the pair of split gate structures 120. The gate capping layer 152 may not cover the upper surface of the erase gate electrode layer 148.

The pair of split gate structures 120a may be spaced apart from each other with a split trench 120Ta therebetween. The split trench 120Ta may include the lower split trench 120TL and the upper split trench 120TUa.

A second impurity region 132 may be formed at an upper part of the active region 112 of the substrate 110 between the pair of split gate structures 120a. For example, the second impurity region 132 may provide the source region of the memory cell device MCc. The support insulator layer 134 may be disposed on the second impurity region 132.

The erase gate structure 140a may be disposed on the support insulator layer 134. The erase gate structure 140a may include the erase gate insulating layer 146 that covers the inner surface of the split trench 120Ta, that is, the bottom surface and the side surface of the split trench 120Ta, and the erase gate electrode layer 148 that is disposed on the erase gate insulating layer 146 and fills at least the portion of the split trench 120Ta.

The pair of gate spacers 160a may cover outer side walls of the pair of split gate structures 120a and both side walls of the gate capping layer 152. Each of the pair of gate spacers 160a may have the stacked structure of the first gate spacer 162a and the second gate spacer 164a disposed on the first gate spacer 162a.

The pair of capping spacers 165a may cover the inner side walls of the pair of gate capping layers 152. Each of the pair of capping spacers 165a may have the stacked structure of the first capping spacer 166a and the second capping spacer 168a disposed on the first capping spacer 166a. In some embodiments, the first capping spacer 166a and the second capping spacer 168a may be formed together with the same material as the first gate spacer 162a and the second gate spacer 164a.

The first capping spacer 166a may have an I shape extending substantially in the vertical direction V with substantially the same thickness, and covering the inner side wall of an upper portion of the second erase gate insulating layer 146b. The second capping spacer 168a may also have an I shape extending substantially in the vertical direction V with substantially the same thickness, and covering the first capping spacer 166a. The thickness of the first capping spacer 166a and the second capping spacer 168a may be substantially the same as the thickness of the first gate spacer 162a and the second gate spacer 164a, respectively.

The lowermost end of the capping spacer 165a may be at the same level as the upper surface of the gate capping layer 152, and the lowermost end of the capping spacer 165a may be at the same level as the upper surface of the erase gate electrode layer 148. For example, each of the lowermost end of the first capping spacer 166a and the lowermost end of the second capping spacer 168a may be at the same level as the lower surface of the erase gate electrode layer 148.

The pair of selection gate structures 180 may be disposed on the outside of the pair of split gate structures 120a. The selection gate structure 180 may cover a portion of the substrate 110 on the outer side of each of the pair of split gate structures 120a and the gate spacer 160a and extend on a portion of the upper surface of the gate capping layer 152. The selection gate structure 180 may include the stacked structure of the selection gate insulating layer 182 and the selection gate electrode layer 184 covering the selection gate insulating layer 182.

FIG. 10 is a cross-sectional view illustrating an IC device 1000 including a memory cell device and a logic device according to embodiments of the inventive concept. Only material differences between the embodiment of FIG. 10 and the embodiments previously described in relation to FIGS. 3, 5 and 7 will be highlighted.

Referring to FIG. 10, the IC device 1000 may include the substrate 110 having the memory cell region MCR, the low voltage logic region LVR, and the high voltage logic region HVR. The low voltage logic region LVR and the high voltage logic region HVR may be referred to as a logic region. FIG. 10 shows that the memory cell device MC shown in FIG. 3 is formed in the memory cell region MCR, but is not limited thereto. For example, the memory cell device MCa shown in FIG. 5, the memory cell device MCb shown in FIG. 7, and the memory cell device MCc shown in FIG. 9 may be formed in the memory cell region MCR, instead of the memory cell device MC shown in FIG. 3.

A first logic transistor LTR may be formed in the low voltage logic region LVR and a second logic transistor HTR may be formed in the high voltage logic region HVR. A operating voltage of the first logic transistor LTR may be less than that of the second logic transistor HTR. The first logic transistor LTR may be referred to as a low voltage logic transistor and the second logic transistor HTR may be referred to as a high voltage logic transistor. The first logic transistor LTR and the second logic transistor HTR may constitute a logic device.

The first logic transistor LTR may include a first gate electrode layer 224 disposed on the active region 112 of the substrate 110, a first gate insulating layer 222 between the first gate electrode layer 224 and the active region 112 of the substrate 110, and a third impurity region 216 disposed on an upper portion of the active region 112 of the substrate 110 on both sides of the first gate electrode layer 224. The third impurity region 216 may be a source/drain region of the first logic transistor LTR.

The second logic transistor HTR may include a second gate electrode layer 244 disposed on the active region 112 of the substrate 110, a second gate insulating layer 242 between the second gate electrode layer 244 and the active region 112 of the substrate 110, and a fourth impurity region 218 disposed on an upper portion of the active region 112 of the substrate 110 on both sides of the second gate electrode layer 244. The third impurity region 218 may be a source/drain region of the second logic transistor HTR.

In some embodiments, the first gate insulating layer 222 and the selection gate insulating layer 182 may have substantially the same thickness and may be formed from the same material(s). In some embodiments, the second gate insulating layer 242 may be an un-removed portion the third cover insulating layers 178 shown, for example, in FIG. 4P. The thickness of the second gate insulating layer 242 may be greater than the thickness of the first gate insulating layer 222.

In some embodiments, the first gate electrode layer 224, the second gate electrode layer 244, and the selection gate electrode layer 184 may have substantially the same thickness and may be formed from substantially the same material(s).

According to various methods of manufacturing the IC device 1000 of FIG. 10, consistent with the foregoing methods embodiments of the inventive concept, some manufacturing processes used to manufacture the memory cell device MC implementing the memory cell region MCR, the first logic transistor LTR formed in the low voltage logic region LVR, and/or the second logic transistor HTR formed in high voltage logic region HVR may be performed together, such that the overall manufacturing process may be simplified and manufacturing costs reduced. In addition, in view of the gate spacer 160, damage to the memory cell device MC potentially arising during the manufacturing processes associated with the first logic transistor LTR and/or the second logic transistor HTR may be prevented, thereby improving reliability of the IC device 1000.

While the inventive concept has been particularly shown and described with reference to embodiments thereof, it will be understood that various changes in form and details may be made therein without departing from the spirit and scope of the following claims.

What is claimed is:

1. An integrated circuit (IC) device comprising:
a source region arranged in an upper portion of a substrate;
a pair of split gate structures respectively on opposing sides of the source region, wherein each of the pair of split gate structures includes a floating gate electrode layer and control gate electrode layers disposed on the floating gate electrode layer;
an erase gate structure between the pair of split gate structures on the source region and including an erase gate electrode layer;
a gate capping layer extending across an upper surface of the erase gate structure;
a pair of selection gate structures respectively on outer sidewalls of the pair of split gate structures; and
a pair of gate spacers, wherein each gate spacer of the pair of gate spacers is disposed between one of the pair of split gate structures and one of the pair of selection gate structures, includes a first gate spacer and a second gate spacer disposed on the first gate spacer, is further disposed on an outer side wall of the one of the pair of split gate structures, and a lowermost end of the second gate spacer is at a lower level than an upper surface of the floating gate electrode layer,
wherein each selection gate structure of the pair of selection gate structures comprises a selection gate insulating layer contacting the second gate spacer and a top surface of the gate capping layer.

2. The IC device of claim 1, wherein the first gate spacer has an L shape including a vertical part contacting the outer side wall of the one of the pair of split gate structures and a horizontal part connected to the vertical part, and
the second gate spacer has an I shape vertically extending along the vertical part of the first gate spacer and covering an upper surface of the horizontal part of the first gate spacer.

3. The IC device of claim 2, wherein the lowermost end of the second gate spacer is at a higher level than a lower surface of the floating gate electrode layer.

4. The IC device of claim 1, wherein the first gate spacer has an I shape and contacts the outer side wall of the one of the pair of split gate structures, and
the second gate spacer has an I shape and covers the first gate spacer.

5. The IC device of claim 1,
wherein the gate capping layer covering covers upper surfaces of control gate electrode layers of the pair of split gate structures,
wherein the pair of gate spacers respectively cover outer side walls of the gate capping layer.

6. The IC device of claim 5, wherein the gate capping layer covers an entire upper surface of the erase gate electrode layer.

7. The IC device of claim 6, wherein the upper surfaces of the control gate electrode layers and the upper surface of the erase gate electrode layer are at a same level.

8. The IC device of claim 1, wherein the first gate spacer includes silicon oxide and the second gate spacer includes silicon nitride.

9. The IC device of claim 1, wherein a thickness of the first gate spacer is less than a thickness of the second gate spacer.

10. The IC device of claim 1, wherein a thickness of the erase gate electrode layer is greater than a thickness of the floating gate electrode layer, and
the thickness of the erase gate electrode layer is greater than a thickness of the control gate electrode layer.

11. An integrated circuit (IC) device comprising:
a substrate including a memory cell region and a logic region;
a memory cell device in the memory cell region, wherein the memory cell device comprises:
a pair of split gate structures separated by a split trench, wherein each of the pair of split gate structures includes a floating gate insulating layer, a floating gate electrode layer, a control gate insulating layer, and a control gate electrode layer sequentially stacked on the substrate;
an erase gate structure filling at least a portion of the split trench and including an erase gate insulating layer and an erase gate electrode layer on the erase gate insulating layer;
a gate capping layer covering an upper surface of the control gate electrode layer for each of the pair of split gate structures and an upper surface of the erase gate electrode layer;
a pair of gate spacers, respectively including a first gate spacer including a first material and a second gate spacer covering the first gate spacer and including a second material different from the first material, wherein each of the pair of gate spacers covers an outer side wall of the gate capping layer and an outer side wall of one of the pair of split gate structures, a lowermost end of the first gate spacer contacts the floating gate insulating layer, and a lowermost end of the second gate spacer is at a level lower than an upper surface of the floating gate electrode layer and higher than a lower surface of the floating gate electrode layer; and
a pair of selection gate structures, wherein each of the pair of selection gate structures includes a selection gate insulating layer including a high-k dielectric material and a selection gate electrode layer including at least one of a metal and a metal nitride, and is disposed on an outer side of one of the pair of split gate structures, so that one of the pair of gate spacers is interposed between one of the pair of selection gate structures and one of the pair of split gate structures,
wherein each selection gate structure of the pair of selection gate structures comprises a selection gate insulating layer contacting the second gate spacer and a top surface of the gate capping layer; and
a logic transistor in the logic region, wherein the logic transistor includes a gate electrode layer disposed on the substrate and a gate insulating layer between the substrate and the gate electrode layer, and the gate insulating layer has a same thickness and a same material as the selection gate insulating layer.

12. The IC device of claim 11, wherein a thickness of the gate capping layer is less than a thickness of the floating gate electrode layer,
the thickness of the gate capping layer is less than a thickness of the control gate electrode layer, and
the thickness of the gate capping layer is about 200 Å to about 400 Å.

13. The IC device of claim 11, wherein a thickness of the erase gate electrode layer is greater than a thickness of the floating gate electrode layer,
the thickness of the erase gate electrode layer is greater than a thickness of the control gate electrode layer, and
the thickness of the erase gate electrode layer is about 400 Å to about 700 Å.

14. The IC device of claim 11, wherein a thickness of the second gate spacer is about 100 Å to about 150 Å,
a thickness of the first gate spacer is less than a thickness of the second gate spacer, and
the thickness of the first gate spacer is about 10 Å to about 100 Å.

15. The IC device of claim 11, wherein a thickness of the second gate spacer is greater than a thickness of the first gate spacer.

* * * * *